(12) United States Patent
Lee et al.

(10) Patent No.: US 12,740,188 B2
(45) Date of Patent: Sep. 15, 2026

(54) DISPLAY DEVICE AND MANUFACTURING METHOD FOR THE SAME

(71) Applicant: Samsung Display Co., LTD., Yongin-si (KR)

(72) Inventors: Won Ho Lee, Yongin-si (KR); Jong Hyuk Kang, Yongin-si (KR); Buem Joon Kim, Yongin-si (KR); Soo Jo Ock, Yongin-si (KR); Hyun Deok Im, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 776 days.

(21) Appl. No.: 17/890,981

(22) Filed: Aug. 18, 2022

(65) Prior Publication Data

US 2023/0231074 A1 Jul. 20, 2023

(30) Foreign Application Priority Data

Jan. 14, 2022 (KR) ........................ 10-2022-0006077

(51) Int. Cl.

| | |
|---|---|
| ***H10H 20/814*** | (2025.01) |
| ***H10H 20/831*** | (2025.01) |
| ***H10H 29/01*** | (2025.01) |
| ***H10H 29/03*** | (2025.01) |
| ***H10H 29/80*** | (2025.01) |

(52) U.S. Cl.

CPC ...... *H10H 20/814* (2025.01); *H10H 20/8312* (2025.01); *H10H 29/012* (2025.01); *H10H 29/03* (2025.01); *H10H 29/032* (2025.01); *H10H 29/034* (2025.01); *H10H 29/0363* (2025.01); *H10H 29/8421* (2025.01)

(58) Field of Classification Search

None

See application file for complete search history.

(56) References Cited

U.S. PATENT DOCUMENTS

| | | | |
|---|---|---|---|
| 8,258,533 | B2 | 9/2012 | Seo et al. |
| 8,648,365 | B2 | 2/2014 | Won |
| 9,773,761 | B2 | 9/2017 | Do |
| 10,818,647 | B2 | 10/2020 | Kim et al. |
| 12,021,170 | B2 | 6/2024 | Li et al. |

(Continued)

FOREIGN PATENT DOCUMENTS

| | | |
|---|---|---|
| KR | 10-2010-0093975 A | 8/2010 |
| KR | 10-2011-0078484 A | 7/2011 |

(Continued)

OTHER PUBLICATIONS

Light-Emitting Device, Manufacturing Method Therefor, and Display Device Comprising Same (Year: 2020).*

(Continued)

*Primary Examiner* — Khaja Ahmad

(74) *Attorney, Agent, or Firm* — Womble Bond Dickinson (US) LLP

(57) ABSTRACT

A display device may include including a first insulating reflective layer including a distributed Bragg reflector above a substrate, a first electrode and a second electrode above the first insulating reflective layer, a second insulating reflective layer including a distributed Bragg reflector above the first electrode and the second electrode, and a light emitting element above the second insulating reflective layer.

18 Claims, 16 Drawing Sheets

(56) References Cited

U.S. PATENT DOCUMENTS

| | | | | |
|---|---|---|---|---|
| 2015/0137081 | A1* | 5/2015 | Kim | H10K 59/879 257/40 |
| 2016/0027977 | A1* | 1/2016 | Seo | H10H 20/856 257/98 |
| 2016/0351754 | A1 | 12/2016 | Kim et al. | |
| 2017/0125748 | A1* | 5/2017 | Choi | H10K 59/35 |
| 2017/0271312 | A1* | 9/2017 | Kwon | H10W 90/00 |
| 2018/0212125 | A1* | 7/2018 | Chen | H10H 20/841 |
| 2021/0288217 | A1* | 9/2021 | Li | H10H 20/84 |
| 2022/0262984 | A1* | 8/2022 | Choi | H10H 20/01 |

FOREIGN PATENT DOCUMENTS

| | | | | |
|---|---|---|---|---|
| KR | 10-1490758 | B1 | 2/2015 | |
| KR | 10-2016-0141925 | A | 12/2016 | |
| KR | 10-2018-0007025 | A | 1/2018 | |
| KR | 10-2020-0010704 | A | 1/2020 | |
| WO | WO-2020017718 | A1 * | 1/2020 | H10H 20/831 |
| WO | WO-2020230989 | A1 * | 11/2020 | H01L 25/167 |

OTHER PUBLICATIONS

Display Device and Manufacturing Method Thereof (Year: 2020).*

Ji-Eun Jung et al., "Highly selective $Si_3N_4/SiO_2$ etching using an $NF_3/N_2/O_2/H_2$ remote plasma. II. Surface reaction mechanism", J. Vac. Sci. Technol. A 38, 023008, doi: 10.1116/1.5125569, Jan. 29, 2020, 7 pages.

* cited by examiner

SPXL
NEA
EMA
NEA
BNK2
CNE1
EA1
EP1
LD
INS3
EP2
CNE2
INS5
DPL
INS4
BNK1
140(INS2)
120(INS1)
CNT1
CNT2
PSV
PCL
ILD2
ILD1
GI
BFL
SUB
I
I'
BML
TE1
GE
ACT
TE2
TR
INP1
ELT1
ELT2
INP2
PL
DR3
100{120 140
ELT{ELT1 ELT2
INP{INP1 INP2
BNK{BNK1 BNK2

FIG. 8

SPXL
BNK2
BNK1
INS2
100(INS1)
PSV
ILD2
ILD1
GI
BFL
SUB
I'
NEA
EMA
NEA
PL
CNT2
INS5
CNE2
EP2
INS3
LD
EP1
EA2
CNE1
INS4
CNT1
INP2
ELT2
ELT1
INP1
TE2
ACT
GE
TE1
TR
BML
I
DR3
DPL
PCL
BNK{BNK1 BNK2
INP{INP1 INP2
ELT{ELT1 ELT2

INP2

LD

ELT2

ELT1

INS2

INP1

100(INS1)

PSV

DR3

DISPLAY DEVICE AND MANUFACTURING METHOD FOR THE SAME

CROSS-REFERENCE TO RELATED APPLICATION

This application claims priority to, and the benefit of, Korean patent application No. 10-2022-0006077 filed on Jan. 14, 2022 in the Korean Intellectual Property Office, the entire disclosure of which is incorporated herein by reference.

BACKGROUND

1. Field

The disclosure generally relates to a display device and a manufacturing method for the same.

2. Related Art

Recently, as interest in information displays increases, research and development of display devices have been continuously conducted.

SUMMARY

Embodiments provide a display device and a manufacturing method for the same, in which the alignment degree of a light emitting alignment is improved, and in which the light emission efficiency of the display device is improved.

In accordance with an aspect of the disclosure, there is provided a display device including a first insulating reflective layer including a distributed Bragg reflector above a substrate, a first electrode and a second electrode above the first insulating reflective layer, a second insulating reflective layer including a distributed Bragg reflector above the first electrode and the second electrode, and a light emitting element above the second insulating reflective layer.

The first insulating reflective layer may be closer to the substrate than the first electrode and the second electrode, wherein the second insulating reflective layer is further from the substrate than the first electrode and the second electrode.

A first surface of the first electrode and the second electrode may contact the first insulating reflective layer, wherein a second surface of the first electrode and the second electrode contacts the second insulating reflective layer.

The first insulating reflective layer may contact the second insulating reflective layer at an area overlapping the light emitting element in a plan view.

The display device may further include a via layer between the substrate and the first insulating reflective layer, wherein the first insulating reflective layer is above the via layer, and wherein a thickness of the first insulating reflective layer is less than a thickness of the via layer.

A thickness of the second insulating reflective layer may be about 4000 Å or less.

The first insulating reflective layer may include alternately located (1_1)th and (1_2)th layers, respective ones of the (1_1)th and the (1_2)th layers forming first pairs, wherein the second insulating reflective layer includes alternately located (2_1)th and (2_2)th layers, respective ones of the (2_1)th and the (2_2)th layers forming second pairs, and wherein a sum of a number of the first pairs and a number of the second pairs is four or more.

The number of the second pairs may be two or less.

The first insulating reflective layer and the second insulating reflective layer may include one of one of silicon oxide (SiOx), silicon nitride (SiNx), silicon oxynitride (SiOxNy), aluminum oxide (AlOx), and titanium oxide (TiOx).

The first insulating reflective layer may include alternately located (1_1)th and (1_2)th layers respectively including silicon oxide (SiOx) and silicon nitride (SiNx), wherein the second insulating reflective layer includes alternately located (2_1)th and (2_2)th layers respectively including silicon oxide (SiOx) and silicon nitride (SiNx).

In accordance with another aspect of the disclosure, there is provided a display device including an insulating reflective layer including a distributed Bragg reflector above a substrate, a first electrode and a second electrode above the insulating reflective layer, an insulating layer above the first electrode and the second electrode, and a light emitting element above the insulating layer.

The insulating layer may include a single-layer structure, wherein the insulating reflective layer includes alternately located first and second layers.

The insulating layer may contact the second layer of the insulating reflective layer, wherein the insulating layer and the second layer include different respective materials.

In accordance with still another aspect of the disclosure, there is provided a method for manufacturing a display device, the method including providing a first insulating reflective layer including a distributed Bragg reflector above a substrate, providing an alignment electrode above the first insulating reflective layer, providing a second insulating reflective layer including a distributed Bragg reflector above the alignment electrode, and locating a light emitting element above the second insulating reflective layer.

The providing of the first insulating reflective layer may include forming one or more first pairs of (1_1)th layers and (1_2)th layers, wherein the providing of the second insulating reflective layer includes forming one or more second pairs of (2_1)th layers and (2_2)th layers, and wherein a sum of a number of the first pairs and a number of the second pairs is four or more.

The number of the second pairs may be two or fewer.

The locating of the light emitting element may include forming an electric field on the second insulating reflective layer with the alignment electrode, and moving the light emitting element based on the electric field.

A thickness of the second insulating reflective layer may be 4000 Å or less.

The first insulating reflective layer and the second insulating reflective layer may include one of one of silicon oxide (SiOx), silicon nitride (SiNx), silicon oxynitride (SiOxNy), aluminum oxide (AlOx), and titanium oxide (TiOx).

There may be provided a display device manufactured according to the above method.

In accordance with still another aspect of the disclosure, there is provided a display device manufactured according to the method.

BRIEF DESCRIPTION OF THE DRAWINGS

Embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 8 is a schematic enlarged view of area EA1 shown in FIG. 7.

FIG. 12 is a schematic enlarged view of area EA2 shown in FIG. 11.

DETAILED DESCRIPTION

Figure 1:
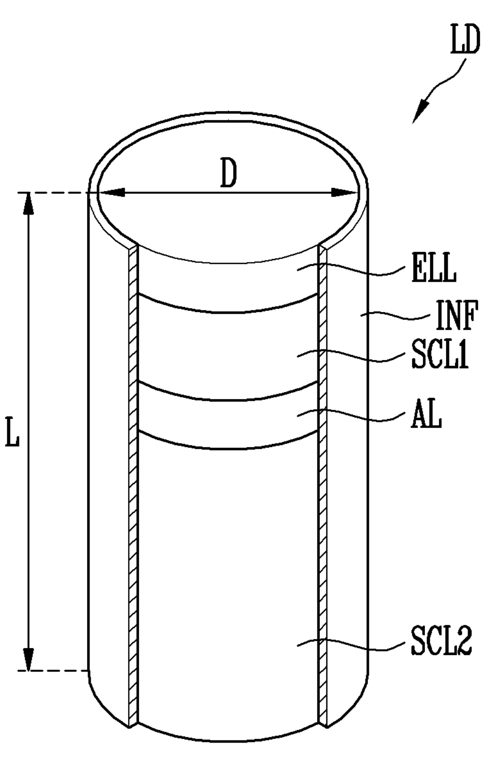
FIGS. 1 and 2 are schematic perspective and sectional views illustrating a light emitting element in accordance with one or more embodiments of the disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present.

In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

First, a light emitting element LD in accordance with one or more embodiments of the disclosure will be described with reference to FIGS. 1 to 4.

Figure 2:
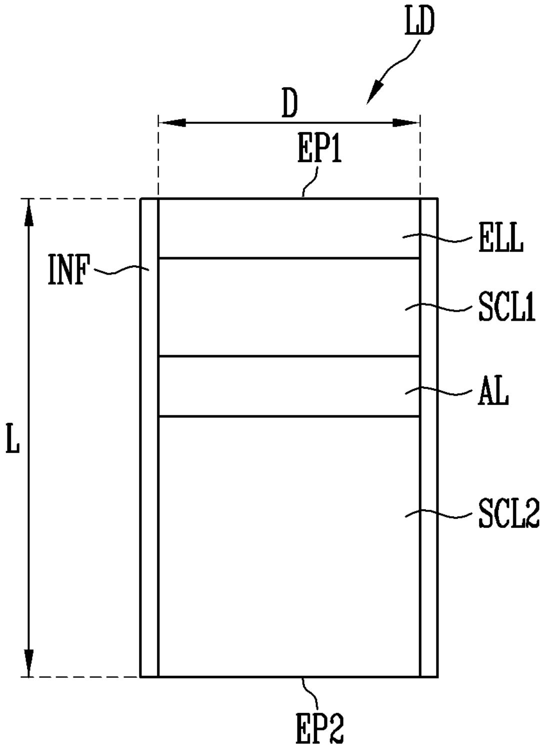
Figure 3:
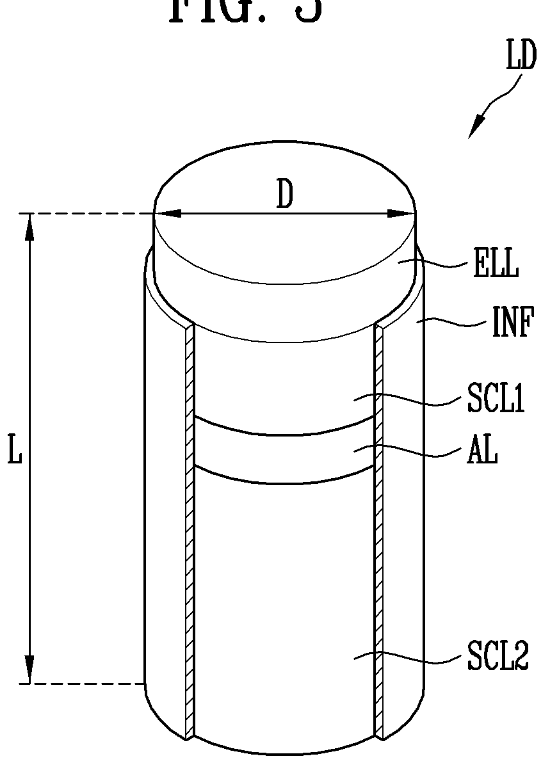
FIGS. 3 and 4 are schematic perspective and sectional views illustrating a light emitting element in accordance with one or more other embodiments of the disclosure.
Figure 4:
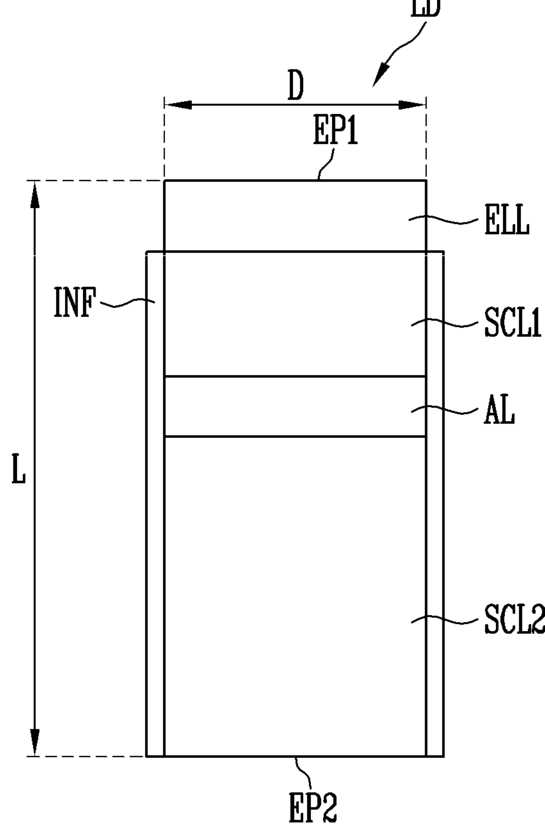

FIGS. 1 and 2 are schematic perspective and sectional views illustrating a light emitting element in accordance with one or more embodiments of the disclosure. FIGS. 3 and 4 are schematic perspective and sectional views illustrating a light emitting element in accordance with one or more other embodiments of the disclosure.

Although a pillar-shaped light emitting element LD is illustrated in FIGS. 1 to 4, the kind and/or shape of the light emitting element LD is not limited thereto.

The light emitting element LD includes a second semiconductor layer SCL2, a first semiconductor layer SCL1, and an active layer AL interposed between the first and second semiconductor layers SCL1 and SCL2. For example, when assuming that an extending direction of the light emitting element LD is a length L direction, the light emitting element LD may include the first semiconductor layer SCL1, the active layer AL, and the second semiconductor layer SCL2, which are sequentially stacked along the length L direction. The light emitting element LD may further include an electrode layer ELL and an insulative film INF.

The light emitting element LD may be provided in a pillar shape extending along one direction. The light emitting element LD may have a first end portion EP1 and a second end portion EP2. The first semiconductor layer SCL1 may be adjacent to the first end portion EP1, and the second semiconductor layer SCL2 may be adjacent to the second end portion EP2. The electrode layer ELL may be adjacent to the first end portion EP1.

The light emitting element LD may be a light emitting element manufactured in a pillar shape through an etching process, or the like. In this specification, the term "pillar shape" may include a rod-like shape or bar-like shape, which is long in the length L direction (e.g., its aspect ratio is greater than 1), such as a cylinder or a polyprism, and the shape of its section is not particularly limited. For example, a length L of the light emitting element LD may be greater than a diameter D (e.g., a width of a cross-section) of the light emitting element LD.

The light emitting element LD may have a size of nanometer scale to micrometer scale. For example, the light emitting element LD may have a diameter D (e.g., a width) in a range of nanometer scale to micrometer scale and/or a length L in a range of nanometer scale to micrometer scale. However, the size of the light emitting element LD is not limited thereto.

The first semiconductor layer SCL1 may be a first conductivity type semiconductor layer. The first semiconductor layer SCL1 is located on the active layer AL, and may include a semiconductor layer having a type that is different from a type of the second semiconductor layer SCL2. For example, the first semiconductor layer SCL1 may include a P-type semiconductor layer. In an example, the first semiconductor layer SCL1 may include at least one semiconductor material among InAlGaN, GaN, AlGaN, InGaN, AlN, and InN, and may include a P-type semiconductor layer doped with a first conductivity type dopant, such as Mg. However, the material constituting the first semiconductor layer SCL1 is not limited thereto. In addition, the first semiconductor layer SCL1 may be configured with various materials.

The active layer AL is located between the first semiconductor layer SCL1 and the second semiconductor layer SCL2, and may be formed in a single-quantum well structure or a multi-quantum well structure. The position of the active layer AL is not limited to a specific example, and may be variously changed according to the kind of the light emitting element LD.

A clad layer doped with a conductive dopant may be formed on the top and/or the bottom of the active layer AL. For example, the clad layer may be formed as an AlGaN layer or an InAlGaN layer. In some embodiments, a material such as AlGaN or AlInGaN may be used to form the active layer AL. In addition, the active layer AL may be configured with various materials.

The second semiconductor layer SCL2 may be a second conductivity type semiconductor layer. The second semiconductor layer SCL2 is located on the active layer AL, and may include a semiconductor layer having a type that is different from the type of the first semiconductor layer SCL1. For example, the second semiconductor layer SCL2 may include an N-type semiconductor layer. For example, the second semiconductor layer SCL2 may include any one semiconductor material among InAlGaN, GaN, AlGaN, InGaN, AlN, and InN, and may include an N-type semiconductor layer doped with a second conductivity type dopant such as Si, Ge, or Sn. However, the material constituting the second semiconductor layer SCL2 is not limited thereto. In addition, the second semiconductor layer SCL2 may be configured with various materials.

When a voltage that is a threshold voltage or more is applied to both ends of the light emitting element LD, the light emitting element LD emits light as electron-hole pairs are combined in the active layer AL. The light emission of the light emitting element LD is controlled by using such a principle, so that the light emitting element LD can be used as a light source for various light emitting devices, including a pixel of a display device.

The insulative film INF may be located on a surface of the light emitting element LD. The insulative film INF may be formed on the surface of the light emitting element LD to surround an outer circumferential surface of at least the active layer AL. In addition, the insulative film INF may further surround respective areas of the first and second semiconductor layers SCL1 and SCL2. The insulative film INF may be formed as a single layer or a multi-layer. However, the disclosure is not limited thereto, and the insulative film INF may be configured with a plurality of layers. For example, the insulative film INF may include a first insulating layer including a first material, and a second insulating layer including a second material that is different from the first material.

The insulative film INF may expose both end portions of the light emitting element LD, which have different polarities. For example, the insulative film INF may expose one end of each of the electrode layer ELL along with the second semiconductor layer SCL2, which are respectively adjacent to the first and second end portions EP1 and EP2 of the light emitting element LD.

The insulative film INF may be configured as a single layer or a multi-layer, including one insulating material among silicon oxide ($SiO_x$), silicon nitride ($SiN_x$), silicon oxynitride ($SiO_xN_y$), aluminum oxide ($AlO_x$), and titanium oxide ($TiO_x$). However, the disclosure is not necessarily limited to the above-described example. For example, in accordance with one or more other embodiments, the insulative film INF may be omitted.

In accordance with one or more embodiments, when the insulative film INF is provided to cover the surface of the light emitting element LD, for example, the outer circumferential surface of the active layer AL, the electrical stability of the light emitting element LD can be ensured. Also, when the insulative film INF is provided on the surface of the light emitting element LD, a surface defect of the light emitting element LD is reduced or minimized, thereby improving the lifetime and efficiency of the light emitting element LD. In addition, even when a plurality of light emitting elements LD are densely located, the likelihood of an unwanted short circuit occurring between the light emitting elements LD can be reduced or prevented.

The electrode layer ELL may be located on the first semiconductor layer SCL1. The electrode layer ELL may be adjacent to the first end portion EP1. The electrode layer ELL may be electrically connected to the first semiconductor layer SCL1.

A portion of the electrode layer ELL may be exposed. For example, the insulative film INF may expose one surface of the electrode layer ELL. The electrode layer ELL may be exposed in an area corresponding to the first end portion EP1.

In some embodiments, a side surface of the electrode layer ELL, or a portion thereof, may be exposed (see FIGS. 3 and 4). For example, the insulative film INF may not cover at least a portion of the side surface of the electrode layer ELL while covering a side surface of each of the first semiconductor layer SCL1, the active layer AL, and the second semiconductor layer SCL2. Thus, the electrode layer ELL adjacent to the first end portion EP1 can be easily connected to another component. In some embodiments, the insulating layer INF may expose not only the side surface of the electrode layer ELL but also a portion of a side surface of the first semiconductor layer SCL1 and/or the second semiconductor layer SCL2.

In accordance with one or more embodiments, the electrode layer ELL may be an ohmic contact electrode. However, the disclosure is not necessarily limited to the above-described example. For example, the electrode layer ELL may be a Schottky contact electrode.

In accordance with one or more embodiments, the electrode layer ELL may include one of chromium (Cr), titanium (Ti), aluminum (Al), gold (Au), nickel (Ni), and any oxide or ally thereof. However, the disclosure is not necessarily limited to the above-described example. In some embodiments, the electrode layer ELL may be substantially transparent. For example, the electrode layer ELL may include indium tin oxide (ITO). Accordingly, emitted light can be transmitted through the electrode layer ELL.

The structure, shape, and the like of the light emitting element LD are not limited to the above-described example. In some embodiments, the light emitting element LD may have various structures and various shapes. For example, the light emitting element LD may further include an additional electrode layer that is located on one surface of the second semiconductor layer SCL2, and that is adjacent to the second end portion EP2.

Figure 5:
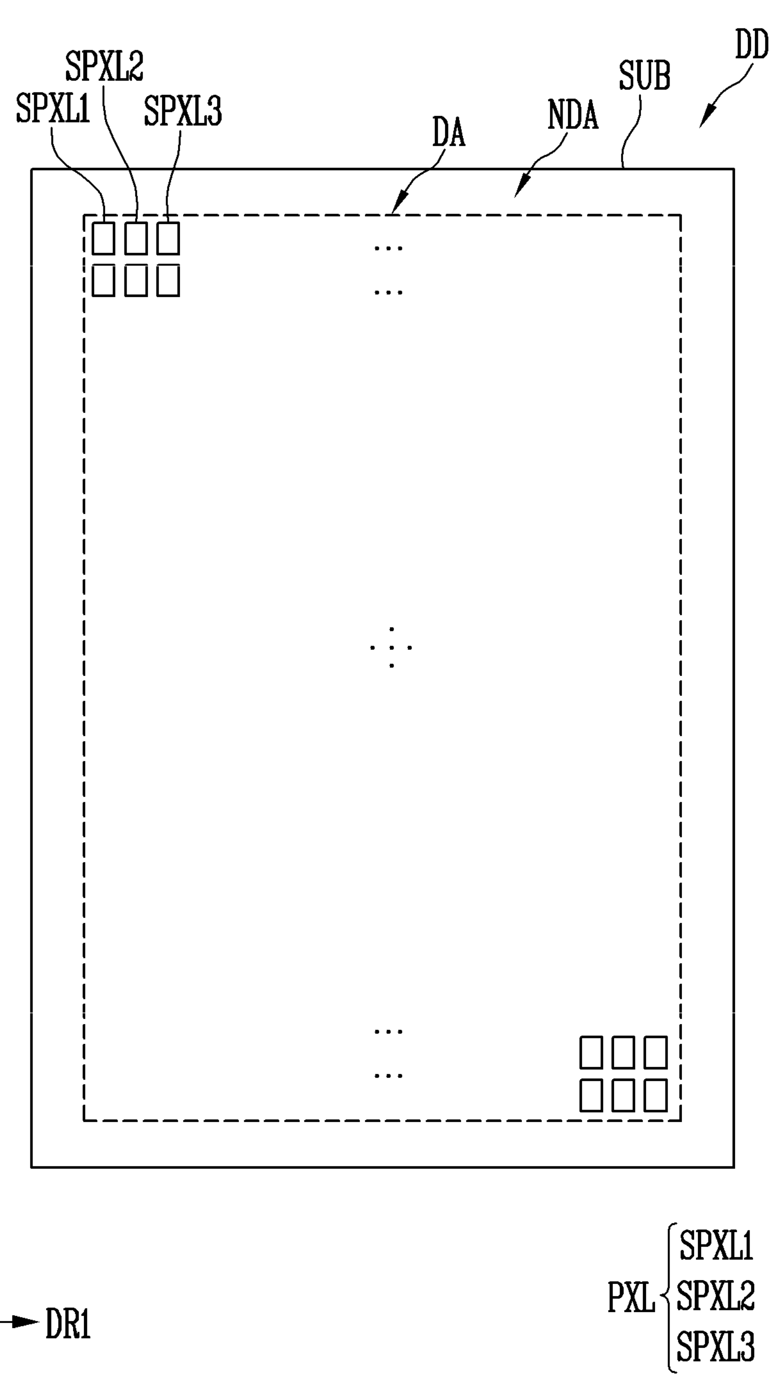
FIG. 5 is a schematic plan view illustrating a display device in accordance with one or more embodiments of the disclosure.

FIG. 5 is a schematic plan view illustrating a display device in accordance with one or more embodiments of the disclosure.

The display device DD is configured to emit light. Referring to FIG. 5, the display device DD may include a substrate SUB, and pixels PXL arranged on the substrate SUB. In one or more other embodiments, the display device DD may further include a driving circuit (e.g., a scan driver and a data driver) for driving the pixels PXL, lines, and pads.

The display device DD may include a display area DA and a non-display area NDA. The non-display area NDA may mean an area excluding the display area DA. The non-display area NDA may surround at least a portion of the display area DA (e.g., in plan view).

The substrate SUB may constitute a base member of the display device DD. The substrate SUB may be a rigid or flexible substrate or film. For example, the substrate SUB may be a rigid substrate made of glass or tempered glass, a flexible substrate (e.g., a thin film) made of a plastic or metal material, or at least one insulating layer. The material and/or property of the substrate SUB is not particularly limited. In one or more embodiments, the substrate may be substantially transparent, meaning that light can be transmitted with a corresponding transmittance (e.g., a predetermined transmittance) or more. In one or more other embodiments, the substrate SUB may be translucent or opaque. Also, the substrate SUB may include a reflective material in some embodiments.

The display area DA may mean an area in which the pixels PXL are located. The non-display area NDA may mean an area in which the pixels PXL are not located.

The driving circuit, the lines, and the pads, which are connected to the pixels PXL of the display area DA, may be located in the non-display area NDA.

In an example, the pixels PXL may be arranged according to a stripe arrangement structure, a PENTILE™ arrangement structure, or the like (e.g., a RGBG matrix structure, a PENTILE™ matrix structure, a PENTILE™ structure, or an RGBG structure, PENTILE™ being a registered trademark of Samsung Display Co., Ltd., Republic of Korea). However, the disclosure is not limited thereto, and various embodiments may be applied in the disclosure.

In accordance with one or more embodiments, the pixel PXL may include a first sub-pixel SPXL1, a second sub-pixel SPXL2, and a third sub-pixel SPXL3. Each of the first sub-pixel SPXL1, the second sub-pixel SPXL2, and the third sub-pixel SPXL3 may be a sub-pixel. At least one first sub-pixel SPXL1, at least one second sub-pixel SPXL2, and at least one third sub-pixel SPXL3 may collectively constitute one pixel unit capable of emitting lights of various colors.

For example, each of the first sub-pixel SPXL1, the second sub-pixel SPXL2, and the third sub-pixel SPXL3 may emit light of a color (e.g., predetermined color). For example, the first sub-pixel SPXL1 may be a red pixel for emitting light of red (e.g., a first color), the second sub-pixel SPXL2 may be a green pixel for emitting light of green (e.g., a second color), and the third sub-pixel SPXL3 may be a blue pixel for emitting light of blue (e.g., a third color). However, the color, kind, and/or number of first, second, and third sub-pixels SPXL1, SPXL2, and SPXL3 constituting each pixel unit are not limited to a specific example.

Hereinafter, a pixel PXL (e.g., a sub-pixel SPXL) in accordance with one or more embodiments of the disclosure will be described with reference to FIGS. 6 to 12.

FIGS. 6 to 12 are views illustrating a pixel PXL (e.g., a sub-pixel SPXL) in accordance with one or more embodiments of the disclosure.

Figure 6:
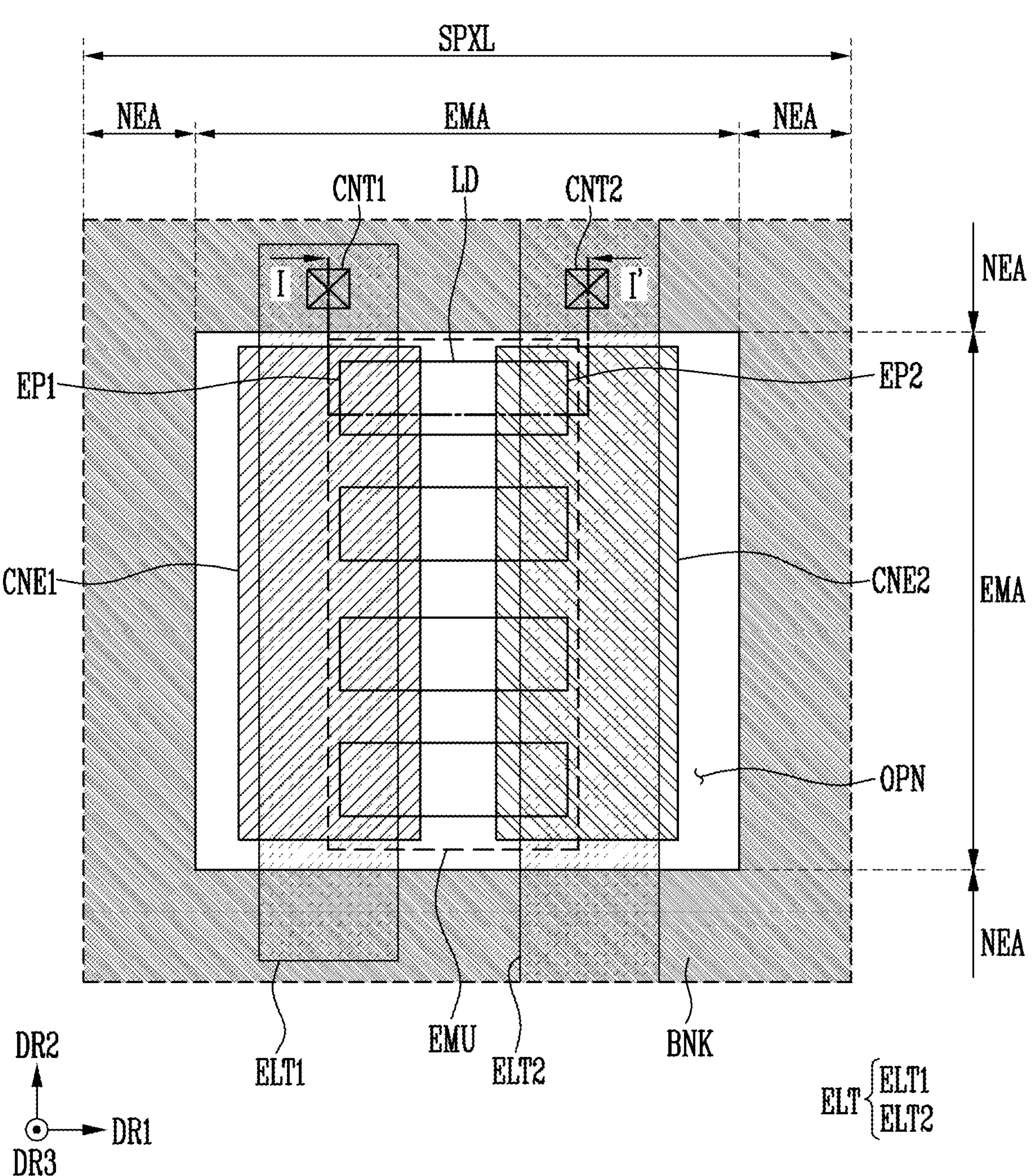
FIG. 6 is a schematic plan view illustrating a sub-pixel in accordance with one or more embodiments of the disclosure.

FIG. 6 is a schematic plan view illustrating a sub-pixel in accordance with one or more embodiments of the disclosure. The sub-pixel SPXL shown in FIG. 6 may be one of the first to third sub-pixels SPXL1, SPXL2, and SPXL3 described above with reference to FIG. 5.

The sub-pixel SPXL may include an emission area EMA and a non-emission area NEA. The sub-pixel SPXL may include a bank BNK, an alignment electrode (see ELT shown in FIG. 7), light emitting elements LD, a first contact electrode CNE1, and a second contact electrode CNE2.

The emission area EMA may overlap with an opening OPN defined by the bank BNK in a plan view. The light emitting elements LD may be located in the emission area EMA.

The light emitting elements LD might not be located in the non-emission area NEA. A portion of the non-emission area NEA may overlap with the bank BNK in a plan view.

The bank BNK may form (e.g., define, or provide) the opening OPN. For example, the bank BNK may have a shape protruding in a thickness direction of the substrate SUB (e.g., in a third direction DR3), and may have a shape surrounding an area (e.g., predetermined area). Accordingly, the opening OPN at which the bank BNK is not located can be formed.

The bank BNK may form a space. The bank BNK may have a shape surrounding a partial area in a plan view. The space may correspond to an area in which a fluid can be accommodated. In accordance with one or more embodiments, the bank BNK may include a first bank (see BNK1 shown in FIG. 7) and a second bank (see BNK2 shown in FIG. 7).

In accordance with one or more embodiments, an ink (see INK shown in FIG. 17) including the light emitting elements LD may be provided in a space defined by the bank BNK (e.g., the first bank BNK1), so that the light emitting elements LD may be located in the opening OPN.

In accordance with one or more embodiments, a color conversion layer (see CCL shown in FIG. 9) may be located (e.g., patterned) in a space defined by the bank BNK (e.g., the second bank BNK2).

The bank BNK may define the emission area EMA and the non-emission area NEA. The bank BNK may surround at least a portion of the emission area EMA in a plan view. For example, an area in which the bank BNK is located may be the non-emission area NEA. An area in which the light emitting elements LD are located, and in which the bank BNK is not located, may be the emission area EMA.

The alignment electrode ELT may be one or more electrodes for aligning the light emitting elements LD. In some embodiments, the alignment electrode ELT may include a first electrode ELT1 and a second electrode ELT2.

The alignment electrode ELT may be configured as a single layer or a multi-layer. For example, the alignment electrode ELT may include at least one reflective electrode layer including a reflective conductive material, and may selectively further include at least one transparent electrode layer and/or at least one conductive capping layer. In some embodiments, the alignment electrode ELT may include one of silver (Al), magnesium (Mg), aluminum (Al), platinum (Pt), palladium (Pd), gold (Au), nickel (Ni), neodymium (Nd), iridium (Ir), chromium (Cr), titanium (Ti), and any alloy thereof. However, the disclosure is not limited to the above-described example, and the alignment electrode ELT may include one of various materials having reflexibility. However, the disclosure is not limited to the above-described example.

The light emitting element LD may be located on the alignment electrode ELT. In some embodiments, at least a portion of the light emitting element LD may be located between the first electrode ELT1 and the second electrode ELT2. The light emitting elements LD may form (e.g., constitute, or be a part of) a light emitting unit EMU. The light emitting unit EMU may mean a unit including adjacent light emitting units LD.

In some embodiments, the light emitting elements LD may be aligned in various manners. For example, one or more embodiments in which the light emitting elements LD are aligned in parallel between the first electrode ELT1 and the second electrode ELT2 is illustrated in FIG. 6. However, the disclosure is not necessarily limited to the above-described example. For example, the light emitting elements LD may be aligned in a series structure, or in series/parallel hybrid structure, and the number of units connected in series and/or in parallel is not particularly limited.

The first electrode ELT1 and the second electrode ELT2 may be spaced apart from each other. For example, the first electrode ELT1 and the second electrode ELT2 may be spaced apart from each other along a first direction DR1 in the emission area EMA, and each of the first electrode ELT1 and the second electrode ELT2 may extend along a second direction DR2.

In accordance with one or more embodiments, the first electrode ELT1 and the second electrode ELT2 are electrodes for aligning the light emitting elements LD. The first electrode ELT1 may be a first alignment electrode, and the second electrode ELT2 may be a second alignment electrode.

The first electrode ELT1 and the second electrode ELT2 may be respectively supplied (e.g., provided) with a first alignment signal and a second alignment signal in a process of aligning the light emitting elements LD. For example, the ink INK including the light emitting elements LD may be supplied (e.g., provided) to the opening OPN defined by the bank BNK (e.g., the first bank BNK1), the first alignment signal may be supplied to the first electrode ELT1, and the second alignment signal may be supplied to the second electrode ELT2. The first alignment signal and the second alignment signal may have different respective waveforms, different respective potentials, and/or different respective phases. Accordingly, an electric field may be formed between (e.g., on) the first electrode ELT1 and the second electrode ELT2, so that the light emitting elements LD can be aligned between the first electrode ELT1 and the second electrode ELT2 based on the electric field.

The first electrode ELT1 may be electrically connected to a circuit element (e.g., a transistor (see TR shown in FIG. 7)) through a first contact part CNT1. In some embodiments, the first electrode ELT1 may provide an anode signal for allowing the light emitting element LD to emit light. The first electrode ELT1 may provide the first alignment signal for aligning the light emitting element LD.

The second electrode ELT2 may be electrically connected to a power line (see PL shown in FIG. 7) through a second contact part CNT2. In some embodiments, the second electrode ELT2 may provide a cathode signal (e.g., a ground signal) for allowing the light emitting element LD to emit light. The second electrode ELT2 may provide the second alignment signal for aligning the light emitting element LD.

The positions of the first contact part CNT1 and the second contact part CNT2 are not limited to positions shown in FIG. 6, and may be appropriately variously changed.

The light emitting element LD may emit light, based on an electrical signal provided thereto. For example, the light emitting element LD may provide light based on a first electrical signal provided from the first contact electrode CNE1 and a second electrical signal provided from the second contact electrode CNE2.

A first end portion EP1 of the light emitting element LD may be located adjacent to the first electrode ELT1, and a second end portion EP2 may be located adjacent to the second electrode ELT2. The first end portion EP1 may or may not overlap with the first electrode ELT1. The second end portion EP2 may or may not overlap with the second electrode ELT2.

In one or more embodiments, the first end portion EP1 of each of the light emitting elements LD may be electrically connected to the first electrode ELT1 through the first contact electrode CNE1. In one or more other embodiments, the first end portion EP1 of each of the light emitting elements LD may be directly connected to the first electrode ELT1. In still one or more other embodiments, the first end portion EP1 of each of the light emitting elements LD is electrically connected to only the first contact electrode CNE1, and is not connected to the first electrode ELT1.

Similarly, the second end portion EP2 of each of the light emitting elements LD may be electrically connected to the second electrode ELT2 through the second contact electrode CNE2. In one or more other embodiments, the second end portion EP2 of each of the light emitting elements LD may be directly connected to the second electrode ELT2. In still one or more other embodiments, the second end portion EP2 of each of the light emitting elements LD is electrically connected to only the second contact electrode CNE2, and not connected to the second electrode ELT2.

The first contact electrode CNE1 and the second contact electrode CNE2 may be respectively located on the first end portions EP1 and the second end portions EP2 of the light emitting elements LD.

The first contact electrode CNE1 may be located on the first end portions EP1 of the light emitting elements LD to be electrically connected to the first end portions EP1. In one or more embodiments, the first contact electrode CNE1 may be located on the first electrode ELT1 to be electrically connected to the first electrode ELT1. The first end portions EP1 of the light emitting elements LD may be connected to the first electrode ELT1 through the first contact electrode CNE1.

The second contact electrode CNE2 may be located on the second end portions EP2 of the light emitting elements LD to be electrically connected to the second end portions EP2. In one or more embodiments, the second contact electrode CNE2 may be located on the second electrode ELT2 to be electrically connected to the second electrode ELT2. The second end portions EP2 of the light emitting elements LD may be connected to the second electrode ELT2 through the second contact electrode CNE2.

Hereinafter, a sectional structure of the sub-pixel SPXL will be mainly described with reference to FIGS. 7 to 12.

A sub-pixel SPXL in accordance with one or more embodiments of the disclosure will be described with reference to FIGS. 7 to 10, and a sub-pixel SPXL in accordance with one or more other embodiments of the disclosure will be described with reference to FIGS. 11 and 12.

First, a pixel circuit layer PCL and a display element layer DPL of the sub-pixel SPXL in accordance with one or more embodiments of the disclosure will be described with reference to FIG. 7, an insulating reflective layer 100 in accordance with one or more embodiments of the disclosure will be described with reference to FIG. 8, a color conversion layer CCL, an optical layer OPL, a color filter layer CPL, and an outer film layer OFL of a pixel PXL in accordance with one or more embodiments of the disclosure will be described with reference to FIG. 9, and the display element layer DPL and the color conversion layer CCL in accordance with one or more embodiments of the disclosure will be described together with reference to FIG. 10.

Figure 7:
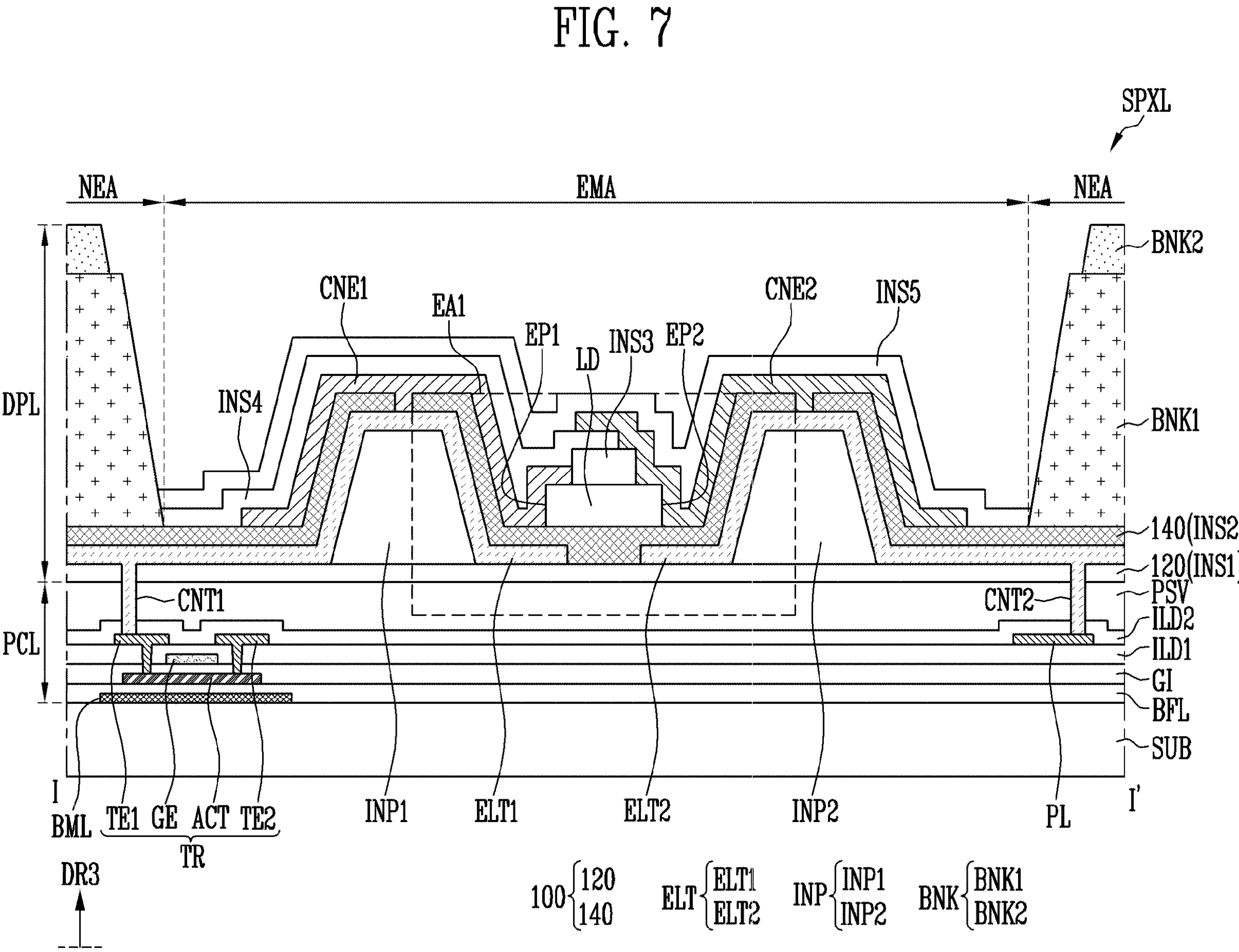
FIG. 7 is a schematic sectional view illustrating a sub-pixel in accordance with one or more embodiments of the disclosure.

FIG. 7 is a schematic sectional view illustrating a sub-pixel in accordance with one or more embodiments of the disclosure.

Referring to FIG. 7, the sub-pixel SPXL may include a substrate SUB, a pixel circuit layer PCL, and a display element layer DPL.

The substrate SUB may form (e.g., constitute) a base member of the sub-pixel SPXL. The substrate SUB may provide an area on which the pixel circuit layer PCL and the display element layer DPL can be located.

The pixel circuit layer PCL may be located on, or above, the substrate SUB. The pixel circuit layer PCL may include a lower auxiliary electrode BML, a buffer layer BFL, a transistor TR, a gate insulating layer GI, a first interlayer insulating layer ILD1, a second interlayer insulating layer ILD2, and a protective layer PSV.

The lower auxiliary electrode BML may be located on the substrate SUB. The lower auxiliary electrode BML may serve as a path through which an electrical signal is moved. In some embodiments, a portion of the lower auxiliary electrode BML may overlap with the transistor TR in a plan view.

The buffer layer BFL may be located on the substrate SUB. The buffer layer BFL may cover the lower auxiliary electrode BML. The buffer layer BFL may reduce or prevent impurities otherwise diffused from the outside. The buffer layer BFL may include one of silicon oxide ($SiO_x$), silicon nitride ($SiN_x$), silicon oxynitride ($SiO_xN_y$), aluminum oxide ($AlO_x$), and titanium oxide ($TiO_x$). However, the disclosure is not limited to the above-described example.

The transistor TR may be a thin film transistor. In accordance with one or more embodiments, the transistor TR may be a driving transistor. The transistor TR may be electrically connected to a light emitting element LD. The transistor TR may be electrically connected to a first end portion EP1 of the light emitting element LD.

The transistor TR may include an active layer ACT, a first transistor electrode TE1, a second transistor electrode TE2, and a gate electrode GE.

The active layer ACT may mean a semiconductor layer. The active layer ACT may be located on the buffer layer BFL. The active layer ACT may include at least one of poly-silicon, Low Temperature Polycrystalline Silicon (LTPS), amorphous silicon, and an oxide semiconductor.

The active layer ACT may include a first contact region in contact with the first transistor electrode TE1 and a second contact region in contact with the second transistor electrode TE2. The first contact region and the second contact region may correspond to a semiconductor pattern doped with an impurity. A region between the first contact region and the second contact region may be a channel region. The channel region may correspond to an intrinsic semiconductor pattern undoped with the impurity.

The gate electrode GE may be located on the gate insulating layer GI. A position of the gate electrode GE may correspond to that of the channel region of the active pattern ACT. For example, the gate electrode GE may be located above the channel region of the active pattern ACT with the gate insulating layer GI interposed therebetween.

The gate insulating layer GI may be located on the buffer layer BFL. The gate insulating layer GI may cover the active pattern ACT. The gate insulating layer GI may include one of silicon oxide ($SiO_x$), silicon nitride ($SiN_x$), silicon oxynitride ($SiO_xN_y$), aluminum oxide ($AlO_x$), and titanium oxide ($TiO_x$). However, the disclosure is not limited to the above-described example.

The first interlayer insulating layer ILD1 may be located on the gate insulating layer GI. The first interlayer insulating layer ILD1 may cover the gate electrode GE. The first interlayer insulating layer ILD1 may include one of silicon oxide ($SiO_x$), silicon nitride ($SiN_x$), silicon oxynitride ($SiO_xN_y$), aluminum oxide ($AlO_x$), and titanium oxide ($TiO_x$). However, the disclosure is not necessarily limited to the above-described example.

The first transistor electrode TE1 and the second transistor electrode TE2 may be located on the first interlayer insulating layer ILD1. The first transistor electrode TE1 may be in contact with the first contact region of the active pattern ACT while penetrating the gate insulating layer GI and the first interlayer insulating layer ILD1, and the second transistor electrode TE2 may be in contact with the second contact region of the active pattern ACT while penetrating the gate insulating layer GI and the first interlayer insulating layer ILD1. In an example, the first transistor electrode TE1 may be a drain electrode, and the second transistor electrode TE2 may be a source electrode. However, the disclosure is not limited thereto.

The first transistor electrode TE1 may be electrically connected to a first electrode ELT1 through a first contact part CNT1 penetrating the protective layer PSV and the second interlayer insulating layer ILD2.

The power line PL may be located on the first interlayer insulating layer ILD1. In some embodiments, the power line PL may be in a same layer as the first transistor electrode TE1 and the second transistor TE2. The power line PL may be electrically connected to a second electrode ELT2 through a second contact part CNT2. The power line PL may supply a power source or an alignment signal through the second electrode ELT2.

The second interlayer insulating layer ILD2 may be located on the first interlayer insulating layer ILD1. The second interlayer insulating layer ILD2 may cover the first transistor electrode TE1, the second transistor electrode TE2, and the power line PL. The second interlayer insulating layer ILD2 may include one of silicon oxide ($SiO_x$), silicon nitride ($SiN_x$), silicon oxynitride ($SiO_xN_y$), aluminum oxide ($AlO_x$), and titanium oxide ($TiO_x$). However, the disclosure is not limited to the above-described example.

The protective layer PSV may be located on the second interlayer insulating layer ILD2. The protective layer PSV may be a via layer in some embodiments. The protective layer PSV may include an organic material to planarize a lower step difference. For example, the protective layer PSV may include an organic material, such as acrylic resin, epoxy resin, phenolic resin, polyamide resin, polyimide resin, unsaturated polyester resin, poly-phenylene ether resin, poly-phenylene sulfide resin, or benzocyclobutene (BCB). However, the disclosure is not necessarily limited thereto, and the protective layer PSV may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In accordance with one or more embodiments, the sub-pixel SPXL may include the first contact part CNT1 and the second contact part CNT2. The first contact part CNT1 and the second contact part CNT2 may penetrate the second interlayer insulating layer ILD2, the protective layer PSV, and a first insulating layer INS1 (e.g., a first insulating reflective layer 120). The first electrode ELT1 and the first transistor electrode TE1 may be electrically connected to each other through the first contact part CNT1. The second electrode ELT2 and the power line PL may be electrically connected to each other through the second contact part CNT2.

The display element layer DPL may be located on the pixel circuit layer PCL. The display element layer DPL may include the first insulating reflective layer 120 (e.g., the first insulating layer INS1), an insulating pattern INP, an alignment electrode ELT, a second insulating reflective layer 140 (e.g., a second insulating layer INS2), a bank BNK, the light emitting element LD, a third insulating layer INS3, a first contact CNE1, a fourth insulating layer INS4, a second contact electrode CNE2, and a fifth insulating layer INS5.

In accordance with one or more embodiments, the insulating reflective layer 100 may include the first insulating reflective layer 120 and the second insulating reflective layer 140. The insulating reflective layer 100 may be configured to reflect light, including a plurality of layers. Also, the insulating reflective layer 100 may stabilize connection between electrode components, and may reduce external influence. In some embodiments, the insulating reflective layer 100 may be a Distributed Bragg Reflector (DBR). For example, the insulating reflective layer 100 may include a plurality of layers having different refractive indices, thereby reflecting light provided from the light emitting element LD. Accordingly, the light emission efficiency of the display device DD can be improved. A detailed sectional structure of the insulating reflective layer 100 will be described later with reference to FIG. 8.

The first insulating reflective layer 120 may be located on the protective layer PSV. In accordance with one or more embodiments, the first insulating reflective layer 120 may mean a Distributed Bragg Reflector (DBR) located on the via layer.

The first insulating reflective layer 120 may be more adjacent to (e.g., closer to) the substrate SUB than the alignment electrode ELT. The first insulating reflective layer 120 may be formed (e.g., patterned) before the alignment electrode ELT is patterned. The first insulating reflective layer 120 may be located between the alignment electrode ELT and the substrate SUB (e.g., the protective layer PSV). A portion of one surface of the first insulating reflective layer 120 may be in contact with the alignment electrode ELT. At least a portion of the other surface of the first insulating reflective layer 120 may be in contact with the protective layer PSV. In some embodiments, a thickness of the first insulating reflective layer 120 may be less than a thickness of the protective layer PSV (e.g., the via layer).

The first insulating reflective layer 120 may be more adjacent to the substrate SUB than the second insulating reflective layer 140. The first insulating reflective layer 120 may be formed (e.g., patterned) before the second insulating reflective layer 140 is patterned.

The first contact part CNT1 and the second contact part CNT2 may be formed in, or through, the first insulating reflective layer 120.

The insulating pattern INP may be formed on the first insulating reflective layer 120. The insulating pattern INP may have various shapes in some embodiments. In one or more embodiments, the insulating pattern INP may protrude in the thickness direction of the substrate SUB (e.g., the third direction DR3). Also, the insulating pattern INP may be formed to have an inclined surface inclined at an angle (e.g., predetermined angle) with respect to the substrate SUB. However, the disclosure is not necessarily limited thereto, and the insulating pattern INP may have a curved shape, a stepped shape, or the like. In an example, the insulating pattern INP may have a section having a semicircular shape, a semi-elliptical shape, or the like.

The insulating pattern INP may function to form a step difference (e.g., predetermined step difference) such that light emitting elements LD can be easily aligned in the emission area. In some embodiments, the insulating pattern INP may be a partition wall.

In accordance with one or more embodiments, a portion of the alignment electrode ELT may be located on the insulating pattern INP. For example, the insulating pattern INP may include a first insulating pattern INP1 and a second insulating pattern INP2. The first electrode ELT1 may be located on the first insulating pattern INP1, and the second electrode ELT2 may be located on the second insulating pattern INP2. Therefore, a reflective wall may be formed on the insulating pattern INP. Accordingly, light emitted from the light emitting element LD may be recycled, or reflected, so that the light emission efficiency of the display device DD can be improved.

The insulating pattern INP may include at least one organic material and/or at least one inorganic material. In an example, the insulating pattern INP may include an organic material such as acrylic resin, epoxy resin, phenolic resin, polyamide resin, polyimide resin, unsaturated polyester resin, poly-phenylene ether resin, poly-phenylene sulfide resin, or benzocyclobutene (BCB). However, the disclosure is not necessarily limited thereto, and the insulating pattern INP may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The alignment electrode ELT may be located on or above the first insulating reflective layer 120 and/or the insulating pattern INP. As described above, a portion of the alignment electrode ELT may be located on the insulating pattern INP to form a reflective wall. An alignment signal for aligning the light emitting element LD may be supplied to the alignment electrode ELT, and an electrical signal for allowing the light emitting element LD to emit light may be supplied to the alignment electrode ELT.

In accordance with one or more embodiments, the alignment electrode ELT may be located between the first insulating reflective layer 120 and the second insulating reflective layer 140. For example, one surface of the alignment electrode ELT may be in contact with the first insulating reflective layer 120, and the other surface of the alignment electrode ELT may be in contact with the second insulating reflective layer 140.

In some embodiments, the alignment electrode ELT may include the first electrode ELT1 and the second electrode ELT2.

The first electrode ELT1 may be electrically connected to the light emitting element LD. The first electrode ELT1 may be electrically connected to the first contact electrode CNE1 through a contact hole formed in the second insulating layer INS2. The first electrode ELT1 may apply an anode signal to the light emitting element LD.

The second electrode ELT2 may be electrically connected to the light emitting element LD. The second electrode ELT2 may be electrically connected to the second contact electrode CNE2 through a contact hole formed in the second insulating layer INS2. The second electrode ELT2 may apply a cathode signal (e.g., a ground signal) to the light emitting element LD.

In accordance with one or more embodiments, one surface of each of the first electrode ELT and the second electrode ELT2 may be in contact with the first insulating reflective layer 120. In some embodiments, the other surface of each of the first electrode ELT and the second electrode ELT2 may be in contact with the second insulating reflective layer 140.

The second insulating reflective layer 140 may be located on the alignment electrode ELT. For example, the second insulating reflective layer 140 may cover the first electrode ELT1 and the second electrode ELT2. In accordance with one or more embodiments, the second insulating reflective layer 140 may mean a Distributed Bragg Reflector (DBR) located on the alignment electrode ELT.

The second insulating reflective layer 140 may be spaced further apart from the substrate SUB than the first insulating reflective layer 120. A portion of one surface of the second insulating reflective layer 140 may be in contact with the alignment electrode ELT, and another portion of the one surface of the second insulating reflective layer 140 may be in contact with the first insulating reflective layer 120.

In accordance with one or more embodiments, an area in which the first insulating reflective layer 120 and the second insulating reflective layer 140 are in contact with each other may overlap with the light emitting element LD in a plan view.

In accordance with one or more embodiments, each of the first insulating reflective layer 120 and the second insulating reflective layer 140 may be a Distributed Bragg Reflector (DBR) including a plurality of layers. As described above, the first insulating reflective layer 120 and the second insulating reflective layer 140 are provided so that the light emission efficiency of the display device DD can be improved. At the same time, the first insulating reflective layer 120 may be located at a layer that is below that of the alignment electrode ELT, and may be designed such that a thickness of the first insulating reflective layer 120 does not exceed a thickness of the second insulating reflective layer 140 located on the alignment electrode ELT. Accordingly, when the alignment electrode ELT forms an electric field to align the light emitting element LD, the likelihood of the intensity of the formed electric field being decreased (e.g., distorted) can be reduced or prevented. The control of an alignment process of the light emitting element LD can be thoroughly made, and consequently, the alignment degree of the light emitting element LD can be improved.

As a result, a technical effect of the DBR can be provided, and concurrently or simultaneously, the intensity of the electric field formed by the alignment electrode ELT is not decreased.

The bank BNK may be located on the second insulating reflective layer 140. In some embodiments, the bank BNK may include a first bank BNK1 and a second bank BNK2.

The first bank BNK1 may be located on the second insulating reflective layer 140. In some embodiments, in a plan view, the first bank BNK1 might not overlap with the emission area EMA, and may overlap with the non-emission area NEA. As described above, the first bank BNK1 may protrude in the thickness direction of the substrate SUB (e.g., the third direction DR3), thereby defining an opening OPN, and a space in which the light emitting elements LD can be provided may be formed in the opening OPN in a process of supplying the light emitting elements LD.

The first bank BNK1 may include an organic material such as acrylic resin, epoxy resin, phenolic resin, polyamide resin, polyimide resin, unsaturated polyester resin, poly-phenylene ether resin, poly-phenylene sulfide resin, or benzocyclobutene (BCB). However, the disclosure is not necessarily limited thereto, and the first bank BNK1 may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The second bank BNK2 may be located on the first bank BNK1. The second bank BNK2 may protrude in the thickness direction of the substrate SUB (e.g., the third direction DR3), thereby defining an opening OPN, and a space in which a color conversion layer CCL is provided may be formed in the opening OPN.

The second bank BNK2 may include an organic material such as acrylic resin, epoxy resin, phenolic resin, polyamide resin, polyimide resin, unsaturated polyester resin, polyphenylene ether resin, poly-phenylene sulfide resin, or benzocyclobutene (BCB). However, the disclosure is not necessarily limited thereto, and the second bank BNK2 may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The light emitting element LD may be located on the second insulating reflective layer 140. In some embodiments, the light emitting element LD may emit light based on an electrical signal provided from the first contact electrode CNE1 and the second contact electrode CNE2.

The light emitting element LD may be located in an area surrounded by the first bank BNK1. The light emitting element LD may be located between the first insulating pattern INP1 and the second insulating pattern INP2.

The third insulating layer INS3 may be located on the light emitting element LD. The third insulating layer INS3 may cover an active layer AL of the light emitting element LD.

The third insulating layer INS3 may expose at least a portion of the light emitting element LD. For example, the third insulating layer INS3 may not cover the first end portion EP1 and a second end portion EP2 of the light emitting element LD. Accordingly, the first end portion EP1 and the second end portion EP2 of the light emitting element LD can be exposed, and may be respectively connected to the first contact electrode CNE1 and the second contact electrode CNE2.

When the third insulating layer INS3 is formed after the light emitting elements LD are completely aligned, a likelihood of the light emitting elements LD being separated from positions at which the light emitting elements LD are aligned can be reduced or prevented.

The third insulating layer INS3 may be configured as a single layer or a multi-layer, and may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). However, the disclosure is not limited to the above-described example.

The first contact electrode CNE1 and the second contact electrode CNE2 may be located on the second insulating reflective layer 140. The first contact electrode CNE1 may be electrically connected to the first end portion EP1 of the light emitting element LD. The second contact electrode CNE2 may be electrically connected to the second end portion EP2 of the light emitting element LD.

The first contact electrode CNE1 may be electrically connected to the first electrode ELT1 through a contact hole penetrating the second insulating reflective layer 140, and the second contact electrode CNE2 may be electrically connected to the second electrode ELT2 through a contact hole penetrating the second insulating reflective layer 140.

The first contact electrode CNE1 and the second contact electrode CNE2 may include a conductive material. For example, the first contact electrode CNE1 and the second contact electrode CNE2 may include a transparent conductive material including one of Indium Tin Oxide (ITO), Indium Zinc Oxide (IZO), and Indium Tin Zinc Oxide (ITZO). Accordingly, light emitted from the light emitting elements LD can be emitted to the outside of the display device DD while passing through the first and second contact electrodes CNE1 and CNE2. However, the disclosure is not necessarily limited to the above-described example.

In accordance with one or more embodiments, after any one of the first contact electrode CNE1 and the second contact electrode CNE2 is patterned, the other of the first contact electrode CNE1 and the second contact electrode CNE2 may be patterned. However, the disclosure is not necessarily limited to the above-described example. The first contact electrode CNE1 and the second contact electrode CNE2 may be patterned at the same time through the same process.

The fourth insulating layer INS4 may be located on or above the second insulating reflective layer 140 and the first contact electrode CNE1. At least a portion of the fourth insulating layer INS4 may be located between the first contact electrode CNE1 and the second contact electrode CNE2, and accordingly, the likelihood of a short-circuit defect between the first contact electrode CNE1 and the second contact electrode CNE2 can be reduced or prevented.

The fifth insulating layer INS5 may be located on or above the fourth insulating layer INS4 and the second contact electrode CNE2. The fifth insulating layer INS5 may protect components of the display element layer DPL from external influence.

Each of the fourth insulating layer INS4 and the fifth insulating layer INS5 may be configured as a single layer or a multi-layer, and may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

Hereinafter, a detailed structure of the insulating reflective layer 100 will be described with reference to FIG. 8.

Figure 8:
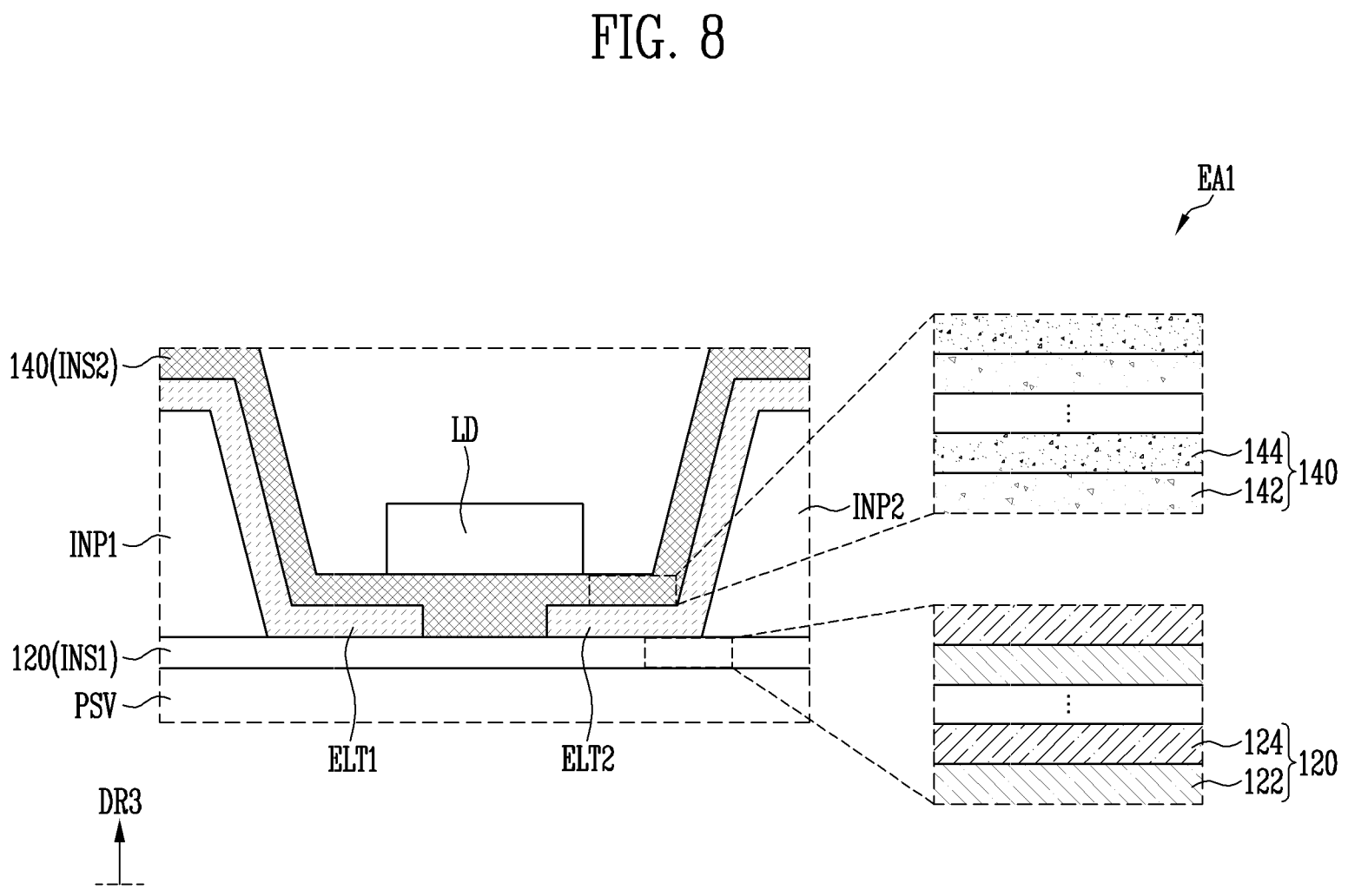

FIG. 8 is a schematic enlarged view of area EA1 shown in FIG. 7. In FIG. 8, for convenience of description, illustration of the first contact electrode CNE1, the second contact electrode CNE2, the third insulating layer INS3, and the fourth insulating layer INS4 is omitted.

Referring to FIG. 8, the first insulating reflective layer 120 may include a plurality of layers. For example, the first insulating reflective layer 120 may include a (1_1)th layer 122 and a (1_2)th layer 124. The structure of layers constituting the first insulating reflective layer 120 may be variously changed. Hereinafter, for convenience of description, one or more embodiments in which the first insulating reflective layer 120 includes the (1_1)th layer 122 and the (1_2)th layer 124 will be mainly described.

In accordance with one or more embodiments, the first insulating reflective layer 120 may have a structure in which the (1_1)th layer 122 and the (1_2)th layer 124, which have different refractive indices, are alternately arranged. For example, a (1_2)th layer 124 may be located on a (1_1)th layer 122, and another (1_1)th layer 122 may be located on the (1_2)th layer 124. In some embodiments, some of (1_2)th layers 124 may be located between adjacent (1_1)th layers 122, and some of (1_1)th layers 122 may be located between adjacent (1_2)th layers 124.

In accordance with one or more embodiments, the (1_1)th layer 122 and the (1_2)th layer 124 may include one of silicon oxide ($SiO_x$), silicon nitride ($SiN_x$), silicon oxynitride ($SiO_xN_y$), aluminum oxide ($AlO_x$), and titanium oxide ($TiO_x$). In some embodiments, while the (1_1)th layer 122 may include silicon oxide ($SiO_x$), the (1_2)th layer 124 may include silicon nitride ($SiN_x$). Alternatively, while the (1_2)th layer 124 may include silicon oxide ($SiO_x$), the (1_1)th layer 122 may include silicon nitride ($SiN_x$). However, the disclosure is not limited to the above-described example.

The second insulating reflective layer 140 may include a plurality of layers. For example, the second insulating reflective layer 140 may include a (2_1)th layer 142 and a (2_2)th layer 144. The structure of layers constituting the second insulating reflective layer 140 may be variously changed. Hereinafter, for convenience of description, one or more embodiments in which the second insulating reflective layer 140 includes the (2_1)th layer 142 and the (2_2)th layer 144 will be mainly described.

In accordance with one or more embodiments, the second insulating reflective layer 140 may have a structure in which the (2_1)th layer 142 and the (2_2)th layer 144, which have different refractive indices, are alternately arranged. For example, a (2_2)th layer 144 may be located on a (2_1)th layer 142, and another (2_1)th layer 142 may be located on the (2_2)th layer 144. In some embodiments, some of (2_2)th layers 144 may be located between adjacent (2_1)th layers 142, and some of (2_1)th layers 142 may be located between adjacent (2_2)th layers 144.

In accordance with one or more embodiments, the (2_1)th layer 142 and the (2_2)th layer 144 may include one of silicon oxide ($SiO_x$), silicon nitride ($SiN_x$), silicon oxynitride ($SiO_xN_y$), aluminum oxide ($AlO_x$), and titanium oxide ($TiO_x$). In some embodiments, while the (2_1)th layer 142 may include silicon oxide ($SiO_x$), the (2_2)th layer 144 may include silicon nitride ($SiN_x$). Alternatively, while the (2_2)th layer 144 may include silicon oxide ($SiO_x$), the (2_1)th layer 142 may include silicon nitride ($SiN_x$). However, the disclosure is not limited to the above-described example.

The first insulating reflective layer 120 and the second insulating reflective layer 140 may constitute a reflector configured to reflect light. As described above, in some embodiments, the first insulating reflective layer 120 and the second insulating reflective layer 140 may constitute a Distributed Bragg Reflector (DBR).

In accordance with one or more embodiments, a number of pairs including layers of the first insulating reflective layer 120, which have different refractive indices, may be two or more. The pair may mean a pair of two different layers. For example, one (1_1)th layer 122 and one (1_2)th layer 124 in the first insulating reflective layer 120 may form one pair. In some embodiments, pairs in the first insulating reflective layer 120 may be designated as first pairs.

In accordance with one or more embodiments, a number of pairs including layers of the second insulating reflective layer 140, which have different refractive indices, may be two or less. In some embodiments, a number of pairs including layers of the second insulating reflective layer 140 may be one. One (2_1)th layer 142 and one (2_2)th layer 144 in the second insulating reflective layer 140 may form one pair.

In some embodiments, the total thickness of the second insulating reflective layer 140 may be about 4000 Å or less. Alternatively, in some embodiments, the total thickness of the second insulating reflective layer 140 may be about 3000 Å or less. However, the disclosure is not necessarily limited to the above-described example. In some embodiments, pairs in the second insulating reflective layer 140 may be designated as second pairs.

In accordance with one or more embodiments, while the sum of the number of pairs in the first insulating reflective layer 120 and the number of pairs in the second insulating reflective layer 140 is four or more, the number of pairs of the second insulating reflective layer 140 may be two or less. The reflection efficiency of the insulating reflective layer 100 with respect to the light emitting element LD is sufficiently ensured, and the number of pairs in the second insulating reflective layer is provided to become a certain level or less. Thus, the intensity of an electric field formed by the first electrode ELT1 and the second electrode ELT2 to align the light emitting element LD is not distorted.

Next, other components of the pixel PXL including the color conversion layer CCL will be described with reference to FIGS. 9 and 10.

Figure 9:
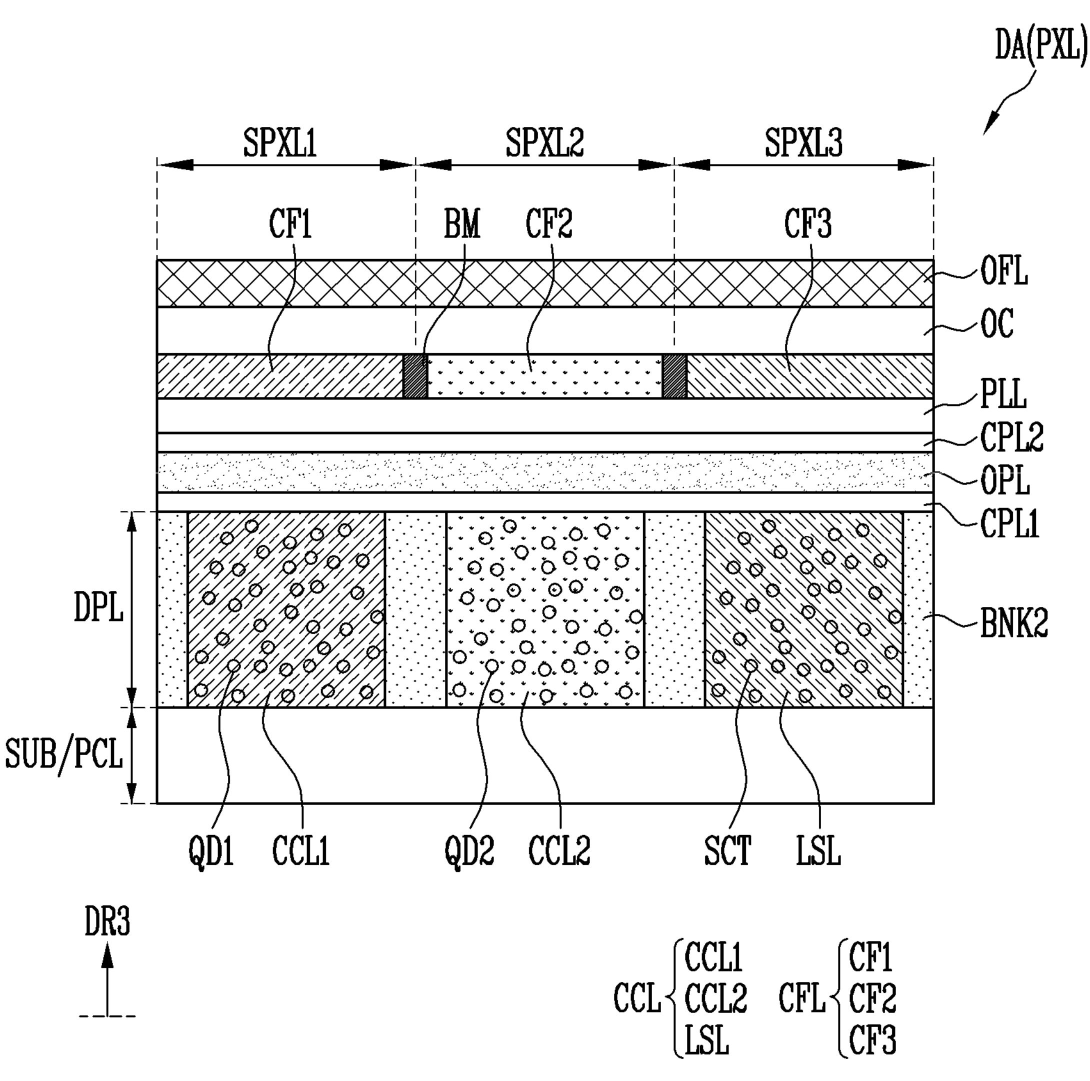
FIG. 9 is a schematic sectional view illustrating first to third sub-pixels in accordance with one or more embodiments of the disclosure.

FIG. 9 is a schematic sectional view illustrating first to third sub-pixels in accordance with one or more embodiments of the disclosure. FIG. 10 is a schematic sectional view illustrating a sub-pixel in accordance with one or more embodiments of the disclosure.

FIG. 9 illustrates the color conversion layer CCL, the optical layer OPL, the color filter layer CFL, and the like. For convenience of description, in FIG. 9, components except the second bank BNK2 in the pixel circuit layer PCL and the display element layer DPL among the above-described components will be omitted. FIG. 10 illustrates a stacked structure of the pixel PXL in relation to the color conversion layer CCL, the optical layer OPL, and the color filter layer CFL.

Figure 10:
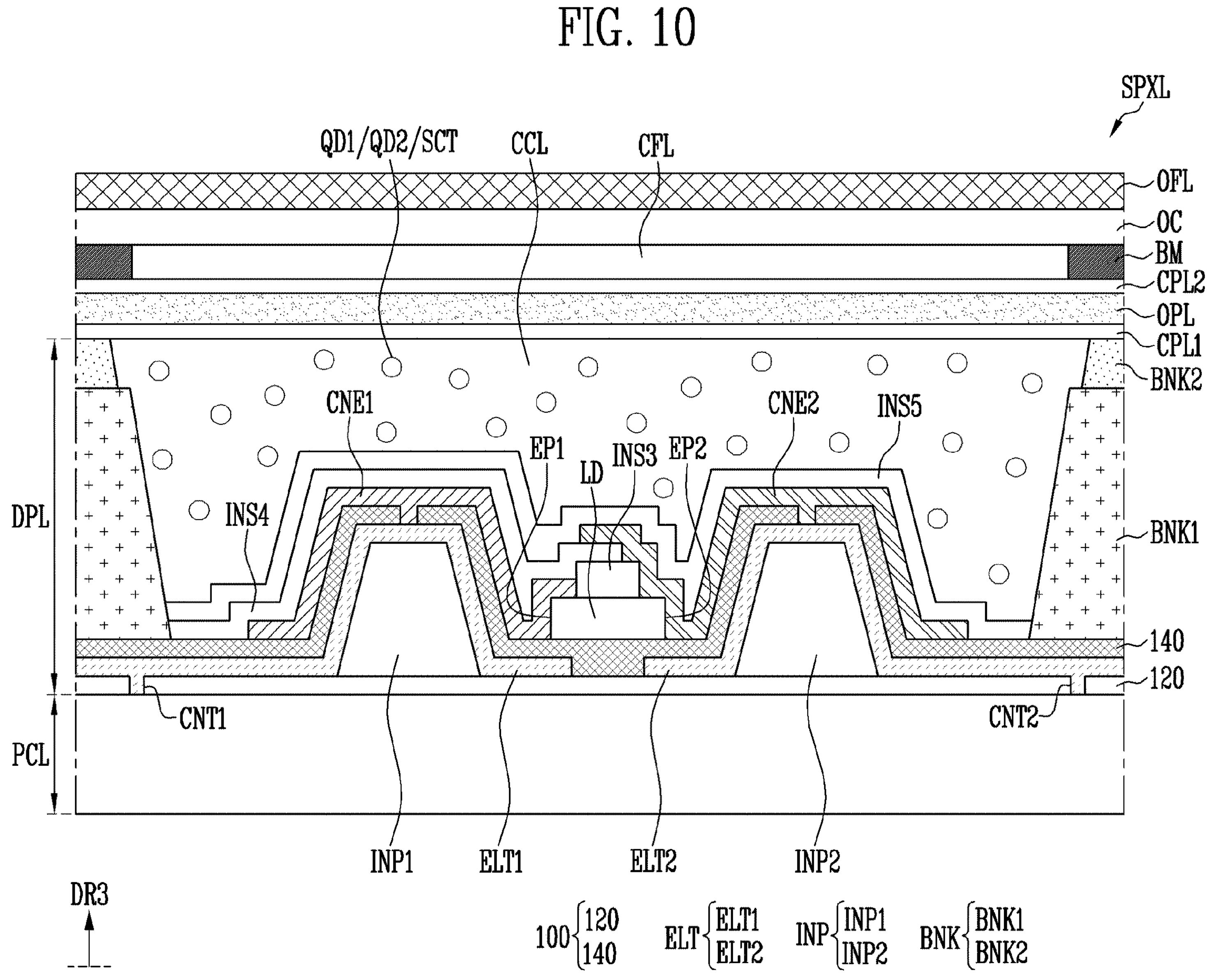
FIG. 10 is a schematic sectional view illustrating a sub-pixel in accordance with one or more embodiments of the disclosure.

Referring to FIGS. 9 and 10, the second bank BNK2 may be located between first to third sub-pixels SPXL1, SPXL2, and SPXL3, or at a boundary of the first to third sub-pixels SPXL1, SPXL2, and SPXL3, and may define a space (e.g., an area) overlapping with each of the first to third sub-pixels SPXL1, SPXL2, and SPXL3. The space defined by the second bank BNK2 may be an area in which the color conversion layer CCL can be provided.

The color conversion layer CCL may be located above light emitting elements LD in the space surrounded by the second bank BNK2. The color conversion layer CCL may include a first color conversion layer CCL1 located in the first sub-pixel SPXL1, a second color conversion layer CCL2 located in the second sub-pixel SPXL2, and a light scattering layer LSL located in the third sub-pixel SPXL3.

In one or more embodiments, the first to third sub-pixels SPXL1, SPXL2, and SPXL3 may include light emitting elements LD emitting light of the same color. For example, the first to third sub-pixels SPXL1, SPXL2, and SPXL3 may include light emitting elements LD emitting light of a third color (e.g., blue). The color conversion layer CCL including color conversion particles may be located on each of the first to third sub-pixels SPXL1, SPXL2, and SPXL3, so that a full-color image can be displayed.

The first color conversion layer CCL1 may include first color conversion particles for converting light of the third color, which is emitted from the light emitting element LD, into light of a first color. For example, the first color conversion layer CCL1 may include a plurality of first quantum dots QD1 dispersed in a matrix material (e.g., predetermined matrix material) such as base resin.

In one or more embodiments, when the light emitting element LD is a blue light emitting element for emitting light of blue, and the first sub-pixel SPXL1 is a red pixel, the first color conversion layer CCL1 may include a first quantum dot QD1 for converting light of blue, which is emitted from the blue light emitting element, into light of red. The first quantum dot QD1 may absorb blue light and may emit red light by shifting a wavelength of the blue light according to energy transition. Meanwhile, when the first sub-pixel SPXL1 is a pixel of another color, the first color conversion layer CCL1 may include a first quantum dot QD1 corresponding to the color of the first sub-pixel SPXL1.

The second color conversion layer CCL2 may include second color conversion particles for converting light of the third color, which is emitted from the light emitting element LD, into light of a second color. For example, the second color conversion layer CCL2 may include a plurality of second quantum dots QD2 dispersed in a matrix material (e.g., predetermined matrix material) such as base resin.

In one or more embodiments, when the light emitting element LD is a blue light emitting element for emitting light of blue, and when the second sub-pixel PXL2 is a green pixel, the second color conversion layer CCL2 may include a second quantum dot QD2 for converting light of blue, which is emitted from the blue light emitting element, into light of green. The second quantum dot QD2 may absorb blue light and emit green light by shifting a wavelength of the blue light according to energy transition. Meanwhile, when the second sub-pixel PXL2 is a pixel of another color, the second color conversion layer CCL2 may include a second quantum dot QD2 corresponding to the color of the second sub-pixel PXL2.

In one or more embodiments, light of blue having a relatively short wavelength in a visible light band is incident into the first quantum dot QD1 and the second quantum dot QD2, so that absorption coefficients of the first quantum dot QD1 and the second quantum dot QD2 can be increased. Accordingly, the efficiency of light finally emitted from the first sub-pixel SPXL1 and the second sub-pixel SPXL2 can be improved, and excellent color reproduction can be ensured. In addition, the light emitting unit EMU of each of the first to third sub-pixels SPXL1, SPXL2, and SPXL3 is configured by using light emitting elements of the same color (e.g., blue light emitting elements), so that the manufacturing efficiency of the display device can be improved.

The light scattering layer LSL may be provided to efficiently use light of the third color (e.g., blue) emitted from the light emitting element LD. In an example, when the light emitting element LD is a blue light emitting element for emitting light of blue, and the third sub-pixel SPXL3 is a blue pixel, the light scattering layer LSL may include at least one kind of light scattering particle SCT to efficiently use light emitted from the light emitting element LD. In an example, the light scattering particle SCT of the light scattering layer LSL may include at least one of barium sulfate ($BaSO_4$), calcium carbonate ($CaCO_3$), titanium oxide ($TiO_2$), silicon oxide ($SiO_2$), aluminum oxide ($Al_2O_3$), zirconium oxide ($ZrO_2$), and zinc oxide (ZnO). Meanwhile, the light scattering particle SCT is not located only in the third sub-pixel SPXL3, and may be selectively included in the first color conversion layer CCL1 or the second color conversion layer CCL2. In some embodiments, the light scattering particle SCT may be omitted such that the light scattering layer LSL configured with transparent polymer is provided.

A first capping layer CPL1 may be located on the color conversion layer CCL. The first capping layer CPL1 may be provided through the first to third sub-pixels SPXL1, SPXL2, and SPXL3. The first capping layer CPL1 may cover the color conversion layer CCL. The first capping layer CPL1 may prevent the color conversion layer CCL from being damaged or contaminated due to infiltration of an impurity, such as moisture or air from the outside.

The first capping layer CPL1 is an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), and the like.

The optical layer OPL may be located on the first capping layer CPL. The optical layer OPL may function to improve light extraction efficiency by recycling light provided from the color conversion layer CCL through total, or near total, reflection. To this end, the optical layer OPL may have a refractive index that is relatively lower than a refractive index of the color conversion layer CCL. For example, the refractive index of the color conversion layer CCL may be about 1.6 to about 2.0, and the refractive index of the optical layer OPL may be about 1.1 to about 1.3.

A second capping layer CPL2 may be located on the optical layer OPL. The second capping layer CPL2 may be provided throughout the first to third sub-pixels SPXL1, SPXL2, and SPXL3. The second capping layer CPL2 may cover the optical layer OPL. The second capping layer CPL2 may reduce or prevent the likelihood of the optical layer OPL being damaged or contaminated due to infiltration of an impurity, such as moisture or air from the outside.

The second capping layer CPL2 is an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), and the like.

A planarization layer PLL may be located on the second capping layer CPL2. The planarization layer PLL may be provided throughout the first to third sub-pixels SPXL1, SPXL2, and SPXL3.

The planarization layer PLL may include an organic material, such as acrylic resin, epoxy resin, phenolic resin, polyamide resin, polyimide resin, unsaturated polyester resin, poly-phenylene ether resin, poly-phenylene sulfide resin, or benzocyclobutene (BCB). However, the disclosure is not necessarily limited thereto, and the planarization layer PLL may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The color filter layer CFL may be located on the planarization layer PLL. The color filter layer CFL may include color filters CF1, CF2, and CF3 that accord with a color of each pixel PXL. The color filters CF1, CF2, and CF3, which accord with a color of each of the first to third sub-pixels SPXL1, SPXL2, and SPXL3, are positioned so that a full-color image can be displayed.

The color filter layer CFL may include a first color filter CF1 located in the first sub-pixel SPXL1 to allow light emitted from the first sub-pixel SPXL1 to be selectively transmitted therethrough, a second color filter CF2 located in the second sub-pixel SPXL2 to allow light emitted from the second sub-pixel SPXL2 to be selectively transmitted therethrough, and a third color filter CF3 located in the third sub-pixel SPXL3 to allow light emitted from the third sub-pixel SPXL3 to be selectively transmitted therethrough.

In one or more embodiments, the first color filter CF1, the second color filter CF2, and the third color filter CF3 may be respectively a red color filter, a green color filter, and a blue color filter, but the disclosure is not necessarily limited thereto. Hereinafter, when an arbitrary color filter among the first color filter CF1, the second color filter CF2, and the third color filter CF3 is designated or when two or more kinds of color filters are inclusively designated, the corresponding color filter or the corresponding color filters are referred to as a "color filter CF" or "color filters CF."

The first color filter CF1 may overlap with the first color conversion layer CCL1 in the thickness direction of the substrate SUB (e.g., the third direction DR3). The first color filter CF1 may include a color filter material for allowing light of a first color (e.g., red) to be selectively transmitted therethrough. For example, when the first sub-pixel SPXL1 is a red pixel, the first color filter CF1 may include a red color filter material.

The second color filter CF2 may overlap with the second color conversion layer CCL2 in the thickness direction of the substrate SUB (e.g., the third direction DR3). The second color filter CF2 may include a color filter material for allowing light of a second color (e.g., green) to be selectively transmitted therethrough. For example, when the second sub-pixel SPXL2 is a green pixel, the second color filter CF2 may include a green color filter material.

The third color filter CF3 may overlap with the light scattering layer LSL in the thickness direction of the substrate SUB (e.g., the third direction DR3). The third color filter CF3 may include a color filter material for allowing light of a third color (e.g., blue) to be selectively transmitted therethrough. For example, when the third sub-pixel SPXL3 is a blue pixel, the third color filter CF3 may include a blue color filter material.

In some embodiments, a light blocking layer BM may be further located between the first to third color filters CF1, CF2, and CF3. As described above, when the light blocking layer BM is formed between the first to third color filters CF1, CF2, and CF3, a color mixture defect viewed at the front or side of the display device DD can be reduced or prevented. The material of the light blocking layer BM is not particularly limited, and the light blocking layer BM may be configured with various light blocking materials. In an example, the light blocking layer BM may be implemented by stacking the first to third color filters CF1, CF2, and CF3.

An overcoat layer OC may be located on the color filter layer CFL. The overcoat layer OC may be provided throughout the first to third sub-pixels SPXL1, SPXL2, and SPXL3. The overcoat layer OC may cover a lower member including the color filter layer CFL. The overcoat layer OC may reduce or prevent moisture or air infiltrating into the above-described lower member. Also, the overcoat layer OC may protect the above-described lower member from a foreign matter, such as dust.

The overcoat layer OC may include an organic material, such as acrylic resin, epoxy resin, phenolic resin, polyamide resin, polyimide resin, unsaturated polyester resin, polyphenylene ether resin, poly-phenylene sulfide resin, or benzocyclobutene (BCB). However, the disclosure is not necessarily limited thereto, and the overcoat layer OC may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The outer film layer OFL may be located on the overcoat layer OC. The outer film layer OFL may be located at an outer portion of the display device DD, to reduce external influence. The outer film layer OFL may be provided throughout the first to third sub-pixels SPXL1, SPXL2, and SPXL3. In some embodiments, the outer film layer OFL may include one of a polyethylenephthalate (PET) film, a low reflective film, a polarizing film, and a transmittance controllable film, but the disclosure is not necessarily limited thereto. In some embodiments, the pixel PXL may include an upper substrate instead of the outer film layer OFL.

Next, a structure of the sub-pixel SPXL in accordance with one or more other embodiments of the disclosure will be described with reference to FIGS. 11 and 12. In FIGS. 11 and 12, descriptions of portions overlapping with those described above will be simplified or will not be repeated.

Figure 11:
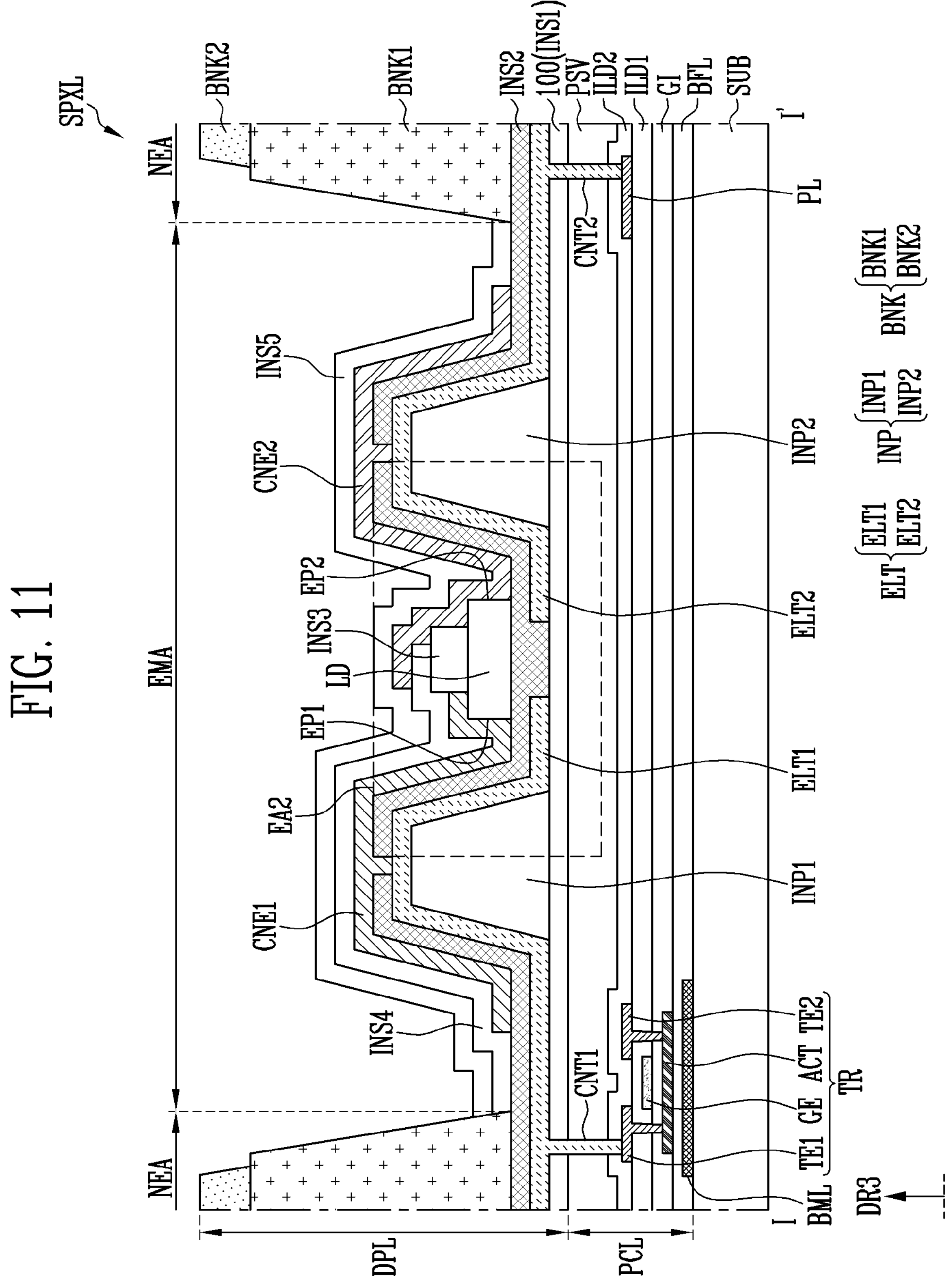
FIG. 11 is a schematic sectional view illustrating a sub-pixel in accordance with one or more embodiments of the disclosure.

FIG. 11 is a schematic sectional view illustrating a sub-pixel in accordance with one or more embodiments of the disclosure. FIG. 12 is a schematic enlarged view of area EA2 shown in FIG. 11.

The sub-pixel SPXL in accordance with one or more other embodiments of the disclosure is different from the sub-pixel SPXL in accordance with one or more embodiments of the disclosure previously disclosed, in that a second insulating layer INS2 located on a rear surface of the light emitting element LD (e.g., a layer corresponding to the position of the second insulating reflective layer 140 in the first embodiment) is formed as a single layer.

Figure 12:
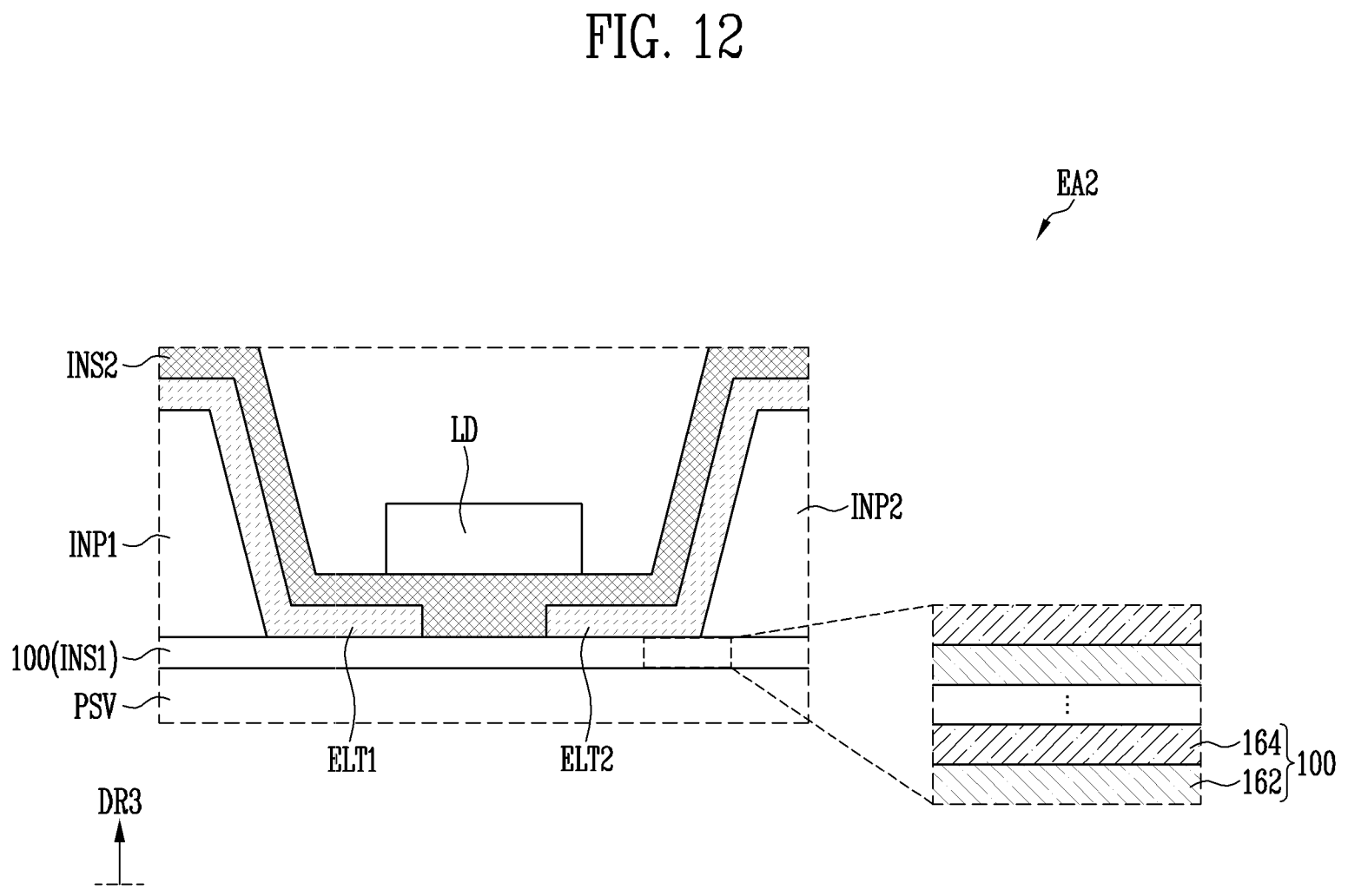

Referring to FIGS. 11 and 12, an insulating reflective layer 100 may be located on the protective layer PSV. The insulating reflective layer 100 may include a first layer 162 and a second layer 164. Similarly to as described above, the first layer 162 and the second layer 164 may have different refractive indices, and accordingly, the insulating reflective layer 100 may be a Distributed Bragg Reflector (DBR).

In some embodiments, the first layer 162 and the second layer 164 may include one of silicon oxide ($SiO_x$), silicon nitride ($SiN_x$), silicon oxynitride ($SiO_xN_y$), aluminum oxide ($AlO_x$), and titanium oxide ($TiO_x$). In some embodiments, while the first layer 162 may include silicon oxide ($SiO_x$), the second layer 164 may include silicon nitride ($SiN_x$). Alternatively, while the second layer 164 may include silicon oxide ($SiO_x$), the first layer 162 may include silicon nitride ($SiN_x$). However, the disclosure is not limited to the above-described example.

Meanwhile, a number of pairs in the insulating reflective layer 100 may be four or more. The pair may mean one pair formed by the first layer 162 and the second layer 164. That is, in some embodiments, the number of pairs in the insulating reflective layer 100 may be provided with a reference (e.g., predetermined reference), so that an appropriate light emission efficiency of the light emitting element LD can be ensured. In the present embodiments, because the second insulating layer INS2 located on the alignment electrode ELT has the structure of a single layer, the intensity of an electric field formed by the alignment electrode ELT is not distorted.

In accordance with one or more embodiments, the second insulating layer INS2 may be located on the first electrode ELT1 and the second electrode ELT2. In some embodiments, the second insulating layer INS2 may have the structure of a single layer. For example, the second insulating layer INS2 may be formed as a single layer, and include one of silicon oxide ($SiO_x$), silicon nitride ($SiN_x$), silicon oxynitride ($SiO_xN_y$), aluminum oxide ($AlO_x$), and titanium oxide ($TiO_x$).

In accordance with one or more embodiments, a refractive index of the second insulating layer INS2 may be different from a refractive index of a layer most adjacent to the second insulating layer INS2, which may be a layer of the insulating reflective layer 100. For example, referring to FIG. 12, the second layer 164 may overlap with the second insulating layer INS2 in a plan view, and may be in contact with the second insulating layer INS2. Accordingly, the second layer 164, which is adjacent to the second insulating layer INS2, and the second insulating layer INS2, may form a pair of the DBR, and may be also configured to reflect light emitted from the light emitting element LD.

In accordance with the present embodiments, a number of layers in the second insulating layer INS2 located on the alignment electrode ELT is provided to become small, as compared with one or more embodiments, so that a likelihood of the intensity of the electric field formed by the alignment electrode ELT being decreased can be reduced or prevented. Accordingly, the alignment of the light emitting element LD can be more thoroughly made. Furthermore, the second insulating layer INS2 along with a partial layer of the insulating reflective layer 100 forms a pair of the DBR, thereby forming a reflective layer.

Hereinafter, a manufacturing method for the display device in accordance with one or more embodiments of the disclosure will be described with reference to FIGS. 13 to 18. In FIGS. 13 to 18, descriptions of portions overlapping with those described above will be simplified or will not be repeated.

Figure 13:
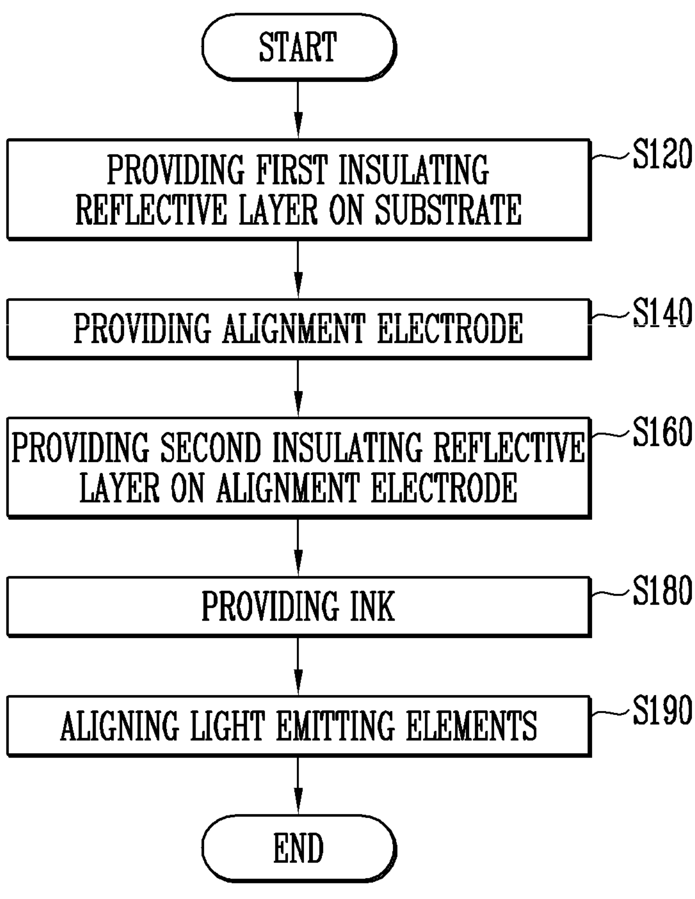
FIG. 13 is a flowchart illustrating a manufacturing method for the display device in accordance with one or more embodiments of the disclosure.

FIG. 13 is a flowchart illustrating a manufacturing method for the display device in accordance with one or more embodiments of the disclosure.

FIGS. 14 to 18 are process (e.g., operation) sectional views schematically illustrating the manufacturing method in accordance with one or more embodiments of the disclosure. FIGS. 14 to 18 mainly illustrate the sectional structure described above with reference to FIG. 7. In FIGS. 14 to 18, for convenience of description, illustration of a detailed configuration of a pixel circuit layer PCL will be omitted.

Referring to FIG. 13, the manufacturing of the display device DD in accordance with one or more embodiments of the disclosure may include operation S120 of providing a first insulating reflective layer on a substrate, operation S140 of providing an alignment electrode, operation S160 of providing a second insulating reflective layer on the alignment electrode, operation S180 of providing an ink, and operation S190 of aligning light emitting elements. Individual components (e.g., an insulating reflective layer 100, an alignment electrode ELT, and the like) described below may be formed by patterning a conductive layer (e.g., a metal layer), an inorganic material, an organic material, or the like through an ordinary process using a mask (e.g., a photolithography process, or the like).

Figure 14:
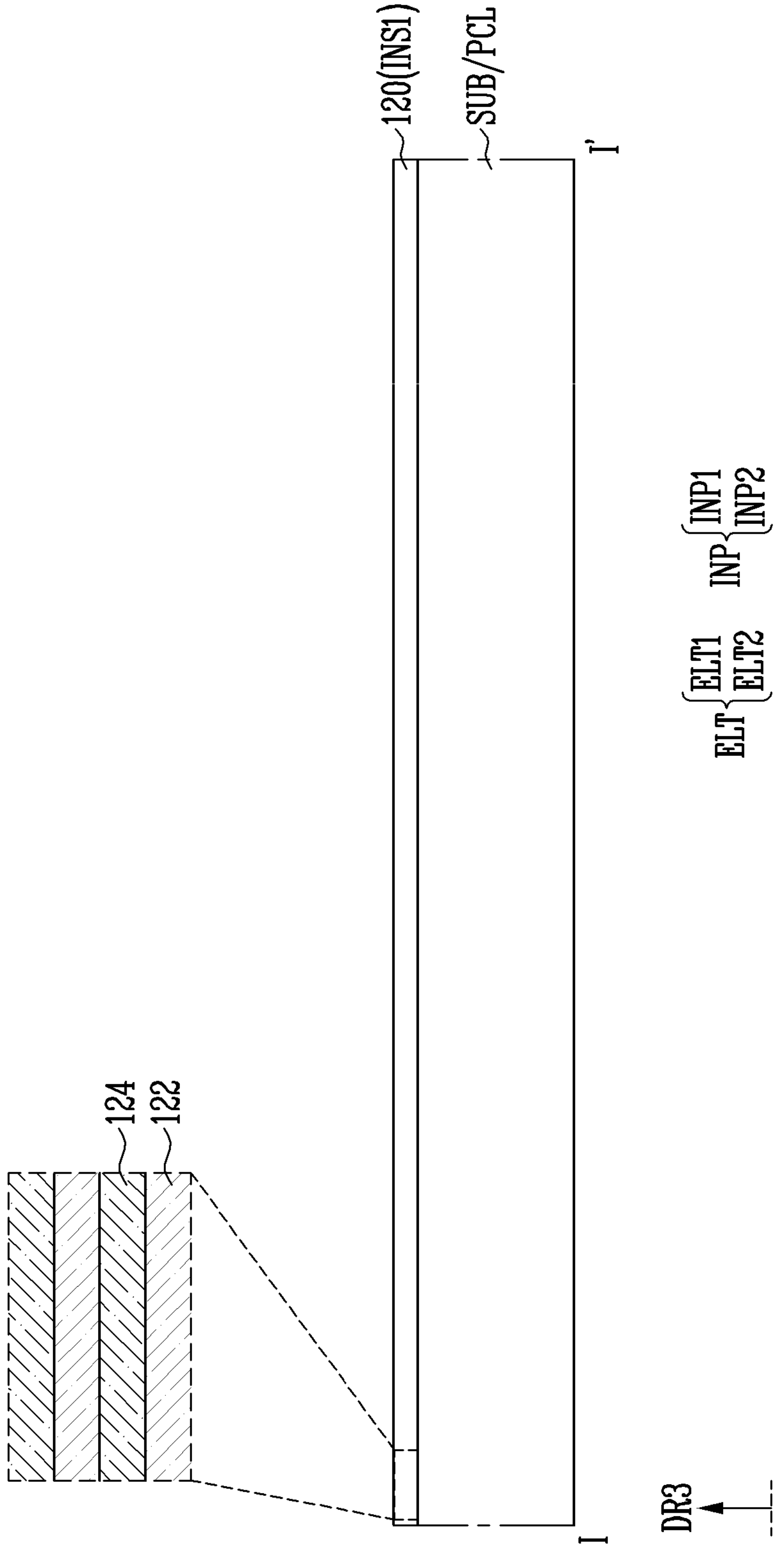
FIGS. 14 to 18 are process (e.g., operation) sectional views schematically illustrating the manufacturing method in accordance with one or more embodiments of the disclosure.

Referring to FIGS. 13 and 14, in the operation S120 of providing the first insulating reflective layer on the substrate, a pixel circuit layer PCL may be located on the substrate SUB, and the first insulating reflective layer 120 may be located on the pixel circuit layer PCL. In FIG. 14, for convenience of description, one or more embodiments in which the first insulating reflective layer 120 includes two (1_1)th layers 122 and two (1_2)th layers 124 are illustrated.

In this operation, the first insulating reflective layer 120 may be formed (e.g., patterned) on the pixel circuit layer PCL. For example, an operation of forming the (1_1)th layer 122 and an operation of forming the (1_2)th layer 124 may be repeatedly performed, thereby forming (e.g., providing) the first insulating reflective layer 120. The (1_1)th layer 122 and the (1_2)th layer 124 may be alternately stacked along a thickness direction of the substrate SUB. Accordingly, a Distributed Bragg Reflector (DBR) can be formed on the pixel circuit layer PCL. For example, the (1_1)th layer 122 and the (1_2)th layer 124 may form a first pair.

In accordance with one or more embodiments, while the (1_1)th layer 122 may include silicon oxide ($SiO_x$), the (1_2)th layer 124 may include silicon nitride ($SiN_x$). Alternatively, while the (1_2)th layer 124 may include silicon oxide ($SiO_x$), the (1_1)th layer 122 may include silicon nitride ($SiN_x$). However, the disclosure is not limited to the above-described example.

Figure 15:
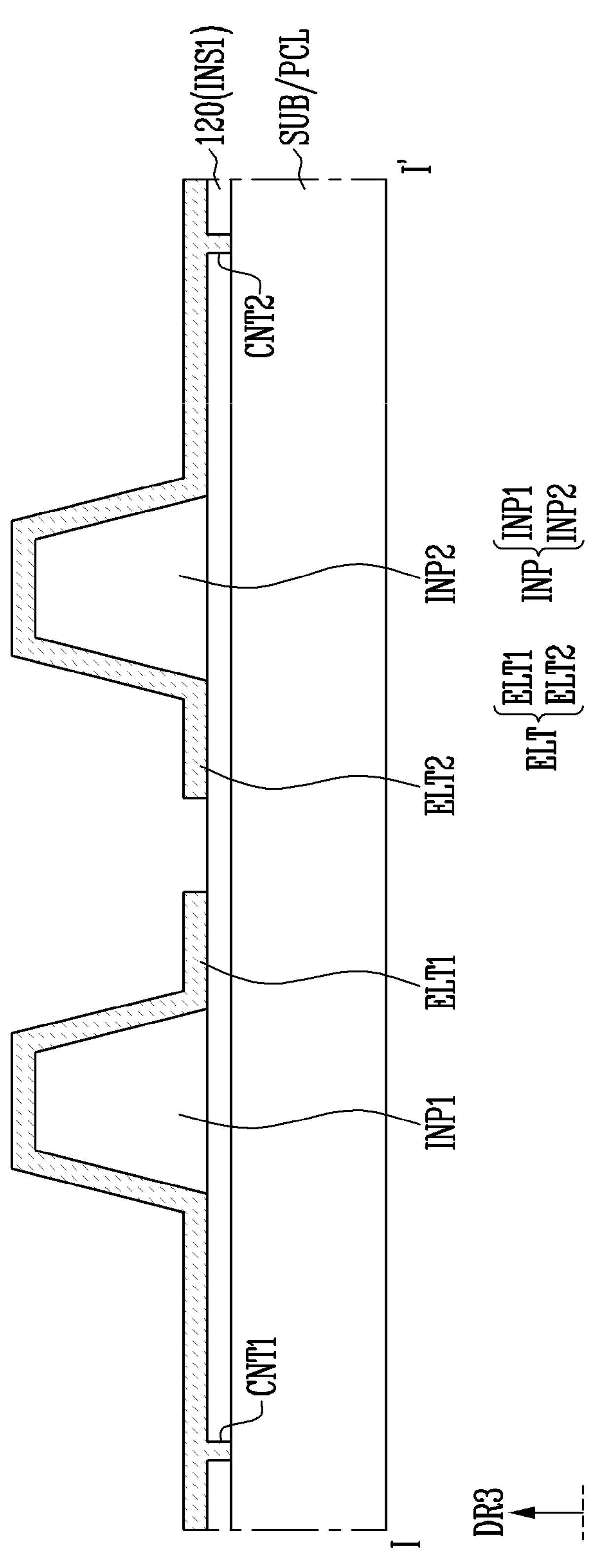

Referring to FIGS. 13 and 15, in the operation S140 of providing the alignment electrode, an insulating pattern INP may be formed on the first insulating reflective layer 120, and the alignment electrode ELT may be formed (e.g., deposited).

In this operation, a first insulating pattern INP1 and a second insulating pattern INP2 may be patterned to form a surface on which the alignment electrode ELT can be arranged.

In this operation, the alignment electrode ELT may be provided on the first insulating reflective layer 120, and a portion of the alignment electrode ELT may be in contact with the first insulating reflective layer 120.

In this operation, in one or more other embodiments, after a base electrode is deposited on the pixel circuit layer PCL, a first electrode ELT1 and a second electrode ELT2 may be patterned by etching a portion of the base electrode. For example, the first electrode ELT1 and the second electrode ELT2 may be patterned to be spaced apart from each other.

Meanwhile, before the base electrode is deposited, holes for forming a first contact part CNT1 and a second contact part CNT2 may be formed in a second interlayer insulating layer ILD2, a protective layer PSV, and the first insulating reflective layer 120. Accordingly, the first contact part CNT1 connected to the first electrode ELT1, and the second contact part CNT2 connected to the second electrode ELT2, can be provided.

In this operation, the first electrode ELT and the second electrode ELT2 may be formed to respectively cover the first insulating pattern INP1 and the second insulating pattern INP2. Accordingly, in this operation, at least a portion of the first electrode ELT1 and the second electrode ELT2 can be provided as a reflective wall.

Figure 16:
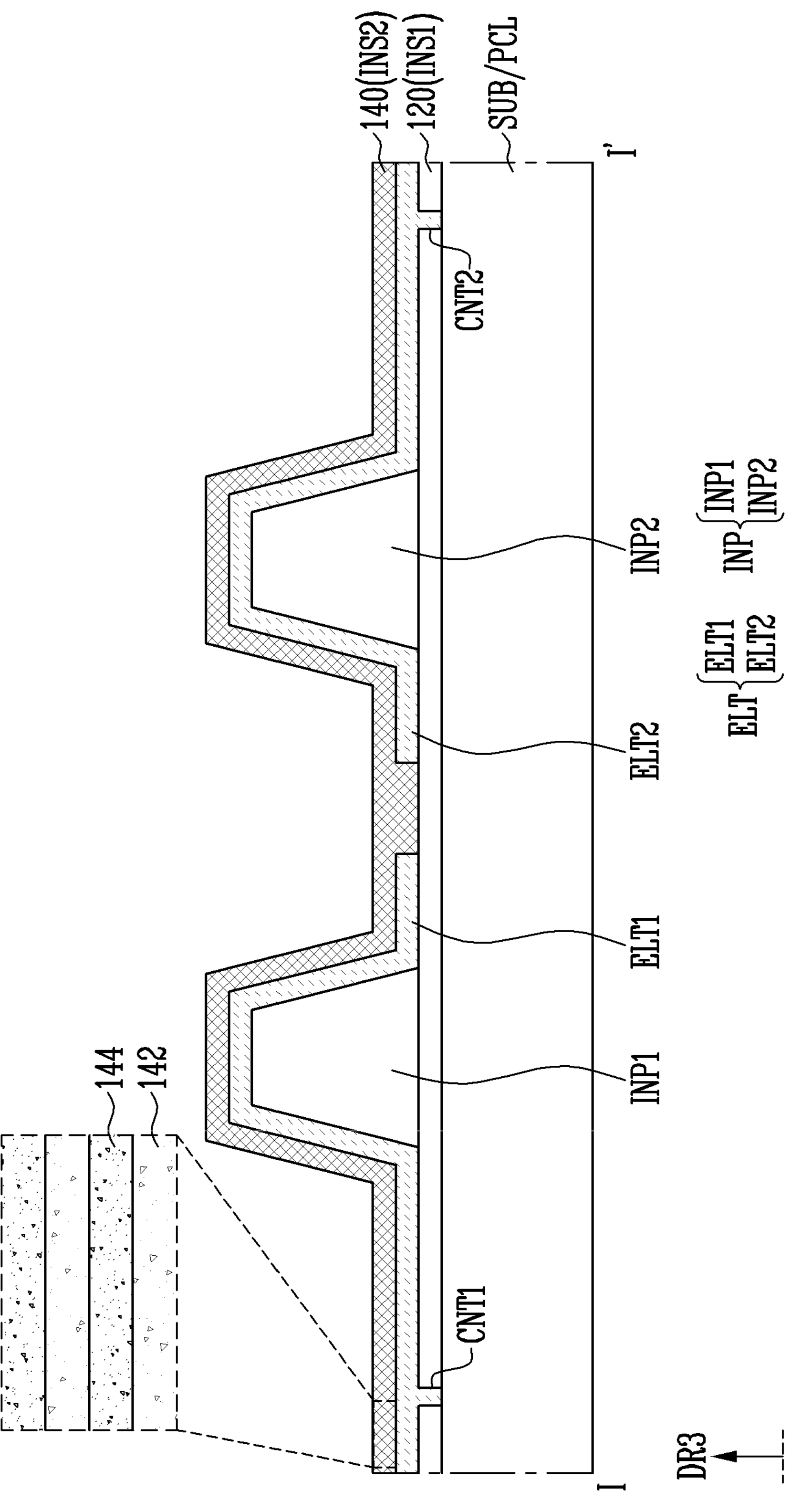

Referring to FIGS. 13 and 16, in the operation S160 of providing the second insulating reflective layer on the alignment electrode, the second insulating reflective layer 140 may be located on the alignment electrode ELT. In FIG. 16, for convenience of description, one or more embodiments in which the second insulating reflective layer 140 includes two (2_1)th layers 142 and two (2_2)th layers 144 are illustrated.

In this operation, the second insulating reflective layer 140 may be formed (e.g., patterned) on the first electrode ELT1 and the second electrode ELT2. For example, an operation of forming the (2_1)th layer 142 and an operation of forming the (2_2)th layer 144 may be repeatedly made, thereby forming (e.g., providing) the second insulating reflective layer 140. The (2_1)th layer 142 and the (2_2)th layer 144 may be alternately stacked along the thickness direction of the substrate SUB. Accordingly, a Distributed Bragg Reflector (DBR) can be formed on the alignment electrode ELT. For example, the (2_1)th layer 142 and the (2_2)th layer 144 may form a second pair.

In accordance with one or more embodiments, while the (2_1)th layer 142 may include silicon oxide ($SiO_x$), the (2_2)th layer 144 may include silicon nitride ($SiN_x$). Alternatively, while the (2_2)th layer 144 may include silicon oxide ($SiO_x$), the (2_1)th layer 142 may include silicon nitride ($SiN_x$). However, the disclosure is not limited to the above-described example.

Meanwhile, in some embodiments, to manufacture the sub-pixel SPXL in accordance with one or more other embodiments of the disclosure, the (2_1)th layer 142 and the (2_2)th layer 144 are not alternately formed, but a single insulating layer may be located. Accordingly, a second insulating layer INS2 having a single-layer structure may be located on the alignment electrode ELT.

In this operation, the second insulating reflective layer 140 may be provided on the alignment electrode ELT to be in contact with the alignment electrode ELT.

In accordance with one or more embodiments, in this operation, a portion of the second insulating reflective layer 140 may be formed (e.g., patterned) on the first insulating reflective layer 120.

Meanwhile, in some embodiments, when the second insulating layer INS2 having the single-layer structure is formed, instead of the second insulating reflective layer 140, so as to provide the sub-pixel SPXL in accordance with one or more other embodiments of the disclosure, a material of the second insulating layer INS2 may be different from a material of a layer adjacent to the second insulating layer INS2, such as a layer of the first insulating reflective layer 120. Accordingly, a partial layer of the first insulating reflective layer 120 and the second insulating layer INS2 can form one pair for forming the DBR.

Figure 17:
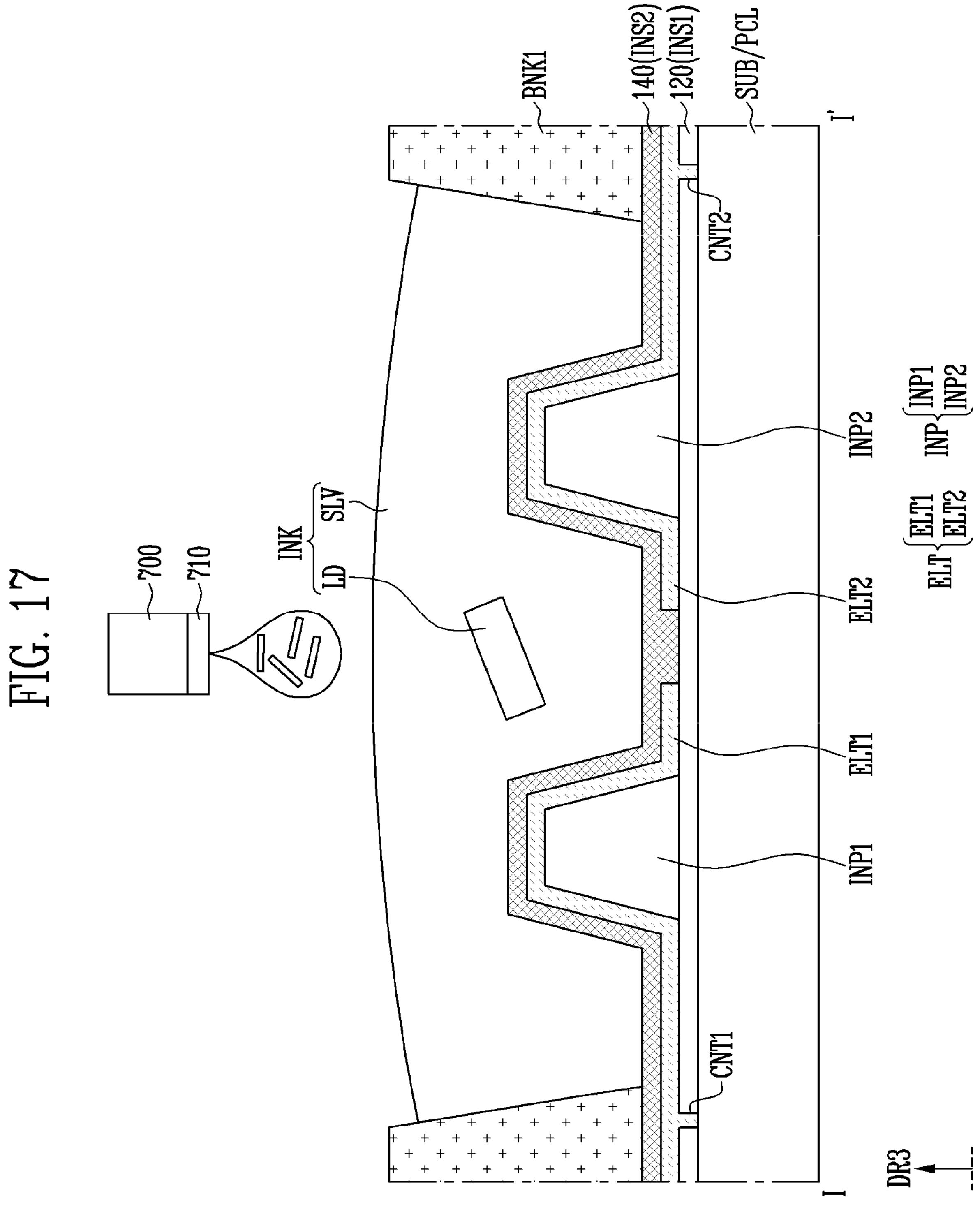

Referring to FIGS. 13 and 17, in the operation S180 of providing the ink, the ink INK may be supplied (e.g., sprayed) onto the substrate SUB (e.g., onto an area above the substrate, such as onto the second insulating reflective layer 140). The ink INK may be provided by a printing apparatus 700 configured to spray a fluid. In some embodiments, the printing apparatus 700 may include a nozzle 710 capable of spraying the fluid, thereby discharging the ink INK to the outside.

In accordance with one or more embodiments, the ink INK may be a liquid mixture that can be discharged by the printing apparatus 700. For example, the ink INK may include light emitting elements LD and a solvent SLV. In some embodiments, the light emitting element LD may be contained by a solid of a range (e.g., predetermined range) in the ink INK. In some embodiments, the solvent SLV may have fluidity, and the light emitting elements LD can be dispersed in the solvent SLV. The solvent SLV may mean a liquid-phase material, instead of a solid-phase material, in which the light emitting elements LD are dispersed and provided. In some embodiments, the solvent SLV may include an organic solvent. For example, the solvent SLV may be one of Propylene Glycol Methyl Ether Acetate (PGMEA), Dipropylene Glycol n-Propyl Ether (DGPE), and triethylene Glycol n-Butyl Ether (TGBE). However, the disclosure is not limited to the above-described example, and the solvent SLV may include various organic solvents.

In the operation S180 of providing the ink, the ink INK may be accommodated in a space defined by a first bank BNK1. In some embodiments, the light emitting element LD included in the ink INK may be randomly located on or above a first insulating layer INS1. For example, the light emitting element LD may be randomly located on the second insulating reflective layer 140.

Figure 18:
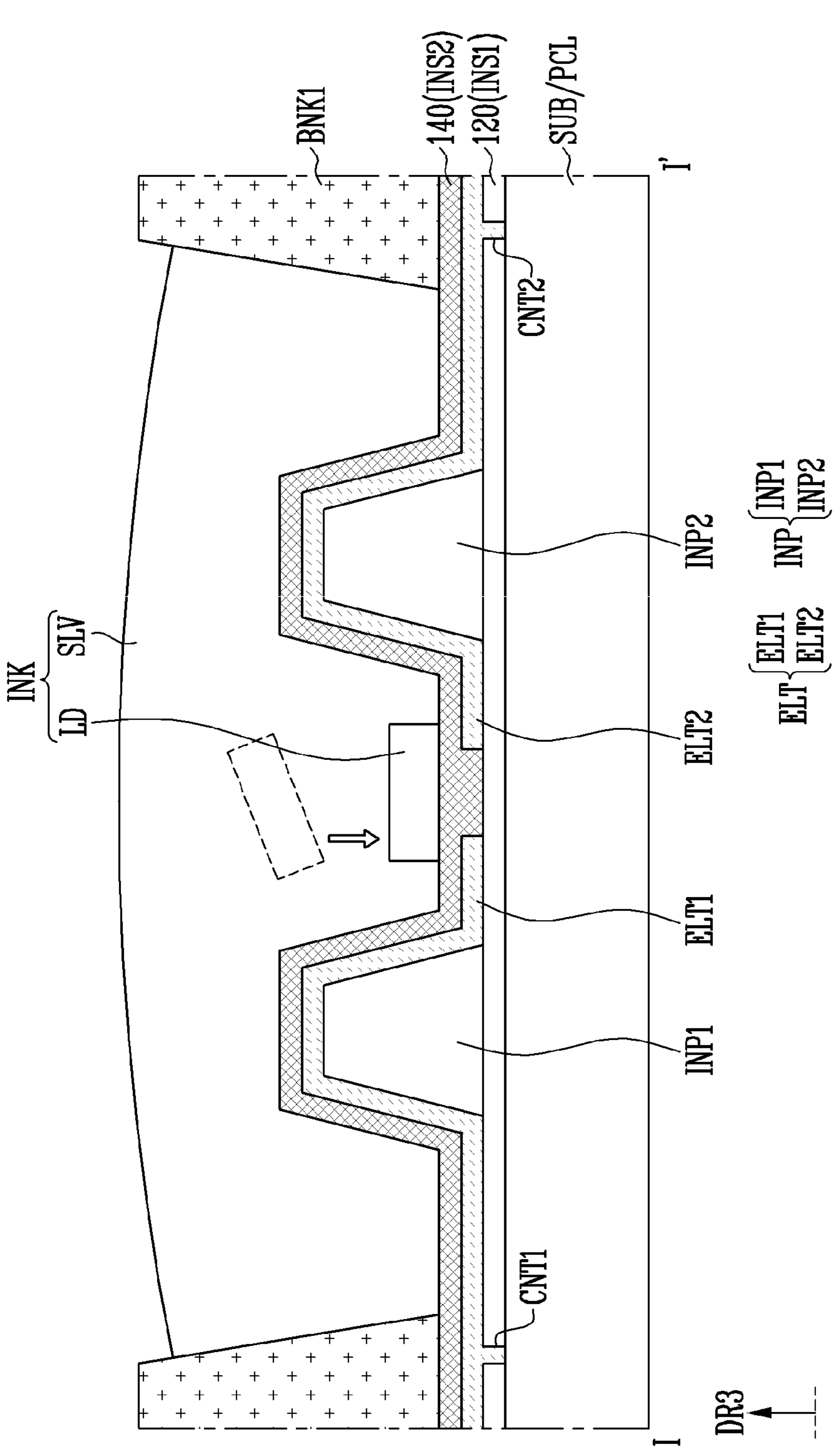

Referring to FIGS. 13 and 18, in the operation S190 of aligning the light emitting elements, the light emitting elements LD may be aligned (e.g., located) on the second insulating reflective layer 140.

In the operation S190 of aligning the light emitting elements, the light emitting elements LD may be located on the alignment electrode ELT with the second insulating reflective layer 140 interposed therebetween. The light emitting elements LD may be located between the first electrode ELT1 and the second electrode ELT2.

In the operation S190 of aligning the light emitting elements, an alignment signal may be provided to the first electrode ELT1 and the second electrode ELT2. For example, an electric field may be formed based on the alignment signal provided to the first electrode ELT1 and the second electrode ELT2, and the light emitting element LD may be moved (e.g., rotated) by a dielectrophoresis (DEP) force based on the electric field. In some embodiments, the alignment signal may be an AC signal. The AC signal may be any one of a sine wave, a triangular wave, a square wave, a trapezoidal wave, and a pulse wave. However, the disclosure is not limited thereto, and the AC signal may have various AC signal forms known in the art.

In accordance with one or more embodiments, the light emitting element LD may be moved based on an electric field formed by the alignment electrode ELT. In some embodiments, the electric field may be formed on the second insulating reflective layer 140. In order to thoroughly align the light emitting element LD, it may be suitable to form an electric field having a sufficient strength. In accordance with one or more embodiments, a portion of the insulating reflective layer 100 is located at a layer below that of the alignment electrode ELT. Thus, the light emission efficiency of the light emitting element LD (e.g., the light emission efficiency of the display device DD) can be improved, and the likelihood of the intensity of an electric field for aligning the light emitting element LD being excessively decreased can be reduced or prevented. Accordingly, the display device DD can be provided, in which the alignment degree of the light emitting element LD is improved, and the light emission efficiency of the light emitting element LD is improved.

Meanwhile, in one or more embodiments, the solvent SLV may be removed.

Subsequently, a display element DPL may be provided by forming a third insulating layer INS3, a first contact electrode CNE1, a second contact electrode CNE2, a fourth insulating layer INS4, a fifth insulating layer INS5, and a second bank BNK2. In addition, a color conversion layer CCL, a color filter layer CFL, and the like may be provided, thereby manufacturing the display device DD in accordance with one or more embodiments of the disclosure.

In accordance with the disclosure, there can be provided a display device and a manufacturing method for the same, in which the alignment degree of a light emitting alignment is improved and the light emission efficiency of the display device is improved.

Embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with any particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure as set forth in the following claims, with functional equivalents thereof to be included therein.

What is claimed is:

1. A display device comprising:

a transistor disposed on a substrate and comprising transistor electrodes formed on a same layer;

a via layer covering the transistor electrodes and comprising an organic material to planarize a lower step difference;

a first insulating reflective layer comprising a distributed Bragg reflector comprising multiple pairs of layers having different respective refractive indices above the substrate and disposed on the via layer;

a first electrode and a second electrode above the first insulating reflective layer;

a second insulating reflective layer comprising a distributed Bragg reflector comprising multiple pairs of layers having different respective refractive indices above the first electrode and the second electrode; and a light-emitting element above the second insulating reflective layer, wherein a thickness of the first insulating reflective layer is less than a thickness of the via layer, wherein the first insulating reflective layer comprises a (1_1)th layer and a (1_2)th layer, and has a structure in which the (1_1)th layer and the (1_2)th layer are alternately disposed, the (1_1)th layer and the (1_2)th layer forming first pairs, wherein the second insulating reflective layer comprises a (2_1)th layer and a (2_2)th layer, and has a structure in which the (2_1)th layer and the (2_2)th layer are alternately disposed, the (2_1)th layer and the (2_2)th layer forming second pairs, wherein the (1_1)th layer and the (2_1)th layer comprise a first material, wherein the (1_2)th layer and the (2_2)th layer comprise a second material different from the first material, and wherein the second insulating reflective layer is directly disposed on the first insulating reflective layer in an area overlapping the light-emitting element along a thickness direction of the substrate.

2. The display device of claim 1, wherein the first insulating reflective layer is closer to the substrate than the first electrode and the second electrode, and wherein the second insulating reflective layer is further from the substrate than the first electrode and the second electrode.

3. The display device of claim 1, wherein a first surface of the first electrode and the second electrode contacts the first insulating reflective layer, and wherein a second surface of the first electrode and the second electrode contacts the second insulating reflective layer.

4. The display device of claim 1, wherein the first insulating reflective layer contacts the second insulating reflective layer at the area overlapping the light-emitting element in a plan view.

5. The display device of claim 1, wherein the first insulating reflective layer is directly disposed on the via layer.

6. The display device of claim 1, wherein a thickness of the second insulating reflective layer is about 4000 Å or less.

7. The display device of claim 1, wherein a sum of a number of the first pairs and a number of the second pairs is four or more.

8. The display device of claim 7, wherein the number of the second pairs is two or less.

9. The display device of claim 1, wherein the first insulating reflective layer and the second insulating reflective layer comprise one of one of silicon oxide ($SiO_x$), silicon nitride ($SiN_x$), silicon oxynitride ($SiO_xN_y$), aluminum oxide ($AlO_x$), and titanium oxide ($TiO_x$).

10. The display device of claim 9, wherein the first material comprises silicon oxide ($SiO_x$), and wherein the second material comprises silicon nitride ($SiN_x$).

11. A display device comprising:

an insulating reflective layer comprising a distributed Bragg reflector comprising multiple pairs of layers having different respective refractive indices above a substrate;

a first electrode and a second electrode above the insulating reflective layer;

an insulating layer above the first electrode and the second electrode; and a light-emitting element above the insulating layer, wherein the insulating layer has a single-layer structure, wherein the insulating reflective layer comprises a first layer and a second layer, and has a structure in which the first layer and the second layer are alternately disposed, and wherein the insulating layer and the second layer contact each other, and comprise different respective materials such that the distributed Bragg reflector is formed.

12. A method for manufacturing a display device, the method comprising:

forming a transistor comprising transistor electrodes formed on a same layer on a substrate;

forming a via layer comprising an organic material to cover the transistor electrodes and planarize a lower step difference;

providing a first insulating reflective layer comprising a distributed Bragg reflector comprising multiple pairs of layers having different respective refractive indices above the substrate, the first insulating reflective layer having a thickness less than a thickness of the via layer on the via layer;

providing an alignment electrode above the first insulating reflective layer;

providing a second insulating reflective layer comprising a distributed Bragg reflector comprising multiple pairs of layers having different respective refractive indices above the alignment electrode; and locating a light-emitting element above the second insulating reflective layer, wherein the providing of the first insulating reflective layer comprises forming a (1_1)th layer and forming a (1_2)th layer, wherein the (1_1)th layer and the (1_2)th layer form a first pair, wherein the providing of the second insulating reflective layer comprises forming a (2_1)th layer and forming a (2_2)th layer, wherein the (2_1)th layer and the (2_2)th layer form a second pair, wherein the (1_1)th layer and the (2_1)th layer comprise a first material, wherein the (1_2)th layer and the (2_2)th layer comprise a second material different from the first material, and wherein the second insulating reflective layer is directly disposed on the first insulating reflective layer in an area overlapping the light-emitting element along a thickness direction of the substrate.

13. The method of claim 12, wherein a sum of a number of the first pairs and a number of the second pairs is four or more.

14. The method of claim 13, wherein the number of the second pairs is two or fewer.

15. The method of claim 12, wherein the locating of the light-emitting element comprises:

forming an electric field on the second insulating reflective layer with the alignment electrode; and moving the light-emitting element based on the electric field.

16. The method of claim 12, wherein a thickness of the second insulating reflective layer is 4000 Å or less.

17. The method of claim 12, wherein the first insulating reflective layer and the second insulating reflective layer comprise one of one of silicon oxide ($SiO_x$), silicon nitride ($SiN_x$), silicon oxynitride ($SiO_xN_y$), aluminum oxide ($AlO_x$), and titanium oxide ($TiO_x$).

18. An electronic device manufactured according to the method of claim 14.

* * * * *